US007859111B2

(12) United States Patent
Okumura

(10) Patent No.: US 7,859,111 B2
(45) Date of Patent: Dec. 28, 2010

(54) COMPUTER IMPLEMENTED METHOD FOR DESIGNING A SEMICONDUCTOR DEVICE, AN AUTOMATED DESIGN SYSTEM AND A SEMICONDUCTOR DEVICE

(75) Inventor: Atsuyuki Okumura, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 740 days.

(21) Appl. No.: 11/146,622

(22) Filed: Jun. 6, 2005

(65) Prior Publication Data

US 2005/0280159 A1 Dec. 22, 2005

(30) Foreign Application Priority Data

Jun. 7, 2004 (JP) ........................... P2004-168594

(51) Int. Cl.
*H01L 23/52* (2006.01)

(52) U.S. Cl. ............... 257/758; 257/773; 257/E23.011; 438/622; 438/637

(58) Field of Classification Search ................. 257/758, 257/E23.011, 773; 438/622, 637

See application file for complete search history.

(56) References Cited

U.S. PATENT DOCUMENTS

| | | | | |
|---|---|---|---|---|
| 5,798,937 | A | 8/1998 | Bracha et al. | |
| 6,747,349 | B1 * | 6/2004 | Al-Dabagh et al. | 257/691 |
| 2003/0005399 | A1 * | 1/2003 | Igarashi et al. | 716/8 |

FOREIGN PATENT DOCUMENTS

| | | |
|---|---|---|
| JP | 11-031787 | 2/1999 |

* cited by examiner

*Primary Examiner*—Matthew E Warren
*Assistant Examiner*—John Lin
(74) *Attorney, Agent, or Firm*—DLA Piper LLP (US)

(57) ABSTRACT

A computer implemented method for designing a semiconductor device, comprising: creating a double cut via including: placing a first line pattern on a chip area, placing a second line pattern on an upper layer of the first line pattern, allocating a first via pattern on an intersection of the first and second line patterns, creating a protrusion line pattern; and allocating a second via pattern on an end of the protrusion line pattern; storing the double cut via; and extracting a single cut via provided on the chip area and replacing the single cut via with the double cut via.

20 Claims, 29 Drawing Sheets

COMPUTER IMPLEMENTED METHOD FOR DESIGNING A SEMICONDUCTOR DEVICE, AN AUTOMATED DESIGN SYSTEM AND A SEMICONDUCTOR DEVICE

CROSS REFERENCE TO RELATED APPLICATIONS AND INCORPORATION REFERENCE

This application is based upon and claims the benefit of priority from the prior Japanese Patent Applications No. P2004-168594, filed on Jun. 7, 2004; the entire contents of which are incorporated herein by reference.

BACKGROUND OF THE INVENTION

1. Field of the Invention

The present invention relates to a semiconductor device, more specifically to a computer implemented method for designing a semiconductor device which includes diagonal wires connected with a plurality of vias, and an automated design system and a semiconductor device designed by the computer implemented method.

2. Description of the Related Art

With the increased miniaturization of an integrated circuit, in a process of designing masks, it has become difficult to manufacture desined wires and vias. Therefore, various methodologies have been developed to manufacture the wires and the vias delineated on the masks as designed to achieve high manufacturing yield and reliability of the integrated circuit.

With regard to interconnect wires of the integrated circuit, a plurality of vias (hereinafter, referred to as "double cut via") has been provided to connect with upper and lower wire layers to prevent an increase in resistance caused by defective vias, and decreased yield caused by disconnection of wires. In addition, to prevent incomplete interconnection between the vias and the wires, end portions of the wires can be extended or expanded by use of optical proximity correction (OPC) or the like.

Recently, to reduce higher resistance between wires, a "diagonal routing" technique has been used in addition to the traditional "right-angle routing" technique which orients wires to 0 or 90 degrees. Since the diagonal routing technique orients wires to 45 or 135 degrees, transistors and cells are routed in a shortest distance.

However, when replacing via with the double cut via, there is a case that widths of the line patterns do not become uniform. Therefore, it has become difficult to manufacture the line patterns and the manufacturing yield and reliability may be decreased. Further, it is necessary to avoid the occurrence of design violation such as patterns having acute angles when replacing the via with the double cut via.

SUMMARY OF THE INVENTION

An aspect of the present invention inheres in a a computer implemented method for designing a semiconductor device encompassing creating a double cut via including: placing a first line pattern on a chip area; placing a second line pattern on an upper layer of the first line pattern so that a longitudinal direction of the second line pattern intersects obliquely to a longitudinal direction of the first line pattern; allocating a first via pattern on an intersection of the first and second line patterns; creating a protrusion line pattern protruding perpendicular to a longitudinal direction of the second line pattern; and allocating a second via pattern on an end of the protrusion line pattern which is connected to the first line pattern; storing the double cut via in a double cut via data storage; and extracting a single cut via provided on the chip area and replacing the single cut via with the double cut via based on a geometrical environment of the single cut via.

Another aspect of the present invention inheres in an automated design system encompassing an automated placement module configured to place a first line pattern on a chip area, place a second line pattern on an upper layer of the first line pattern so that a longitudinal direction of the second line pattern intersects obliquely to a longitudinal direction of the first line pattern, and allocate a single cut via on an intersection of the first and second line patterns; a double cut via create module configured to create a double cut via, creating first and second via patterns, allocating a first via pattern on an intersection of the first and second line patterns, creating a protrusion line pattern protruding perpendicular to a longitudinal direction of the second line pattern, allocating a second via pattern on an end of the protrusion line pattern which is connected to the first line pattern and storing the double cut via including first and second via patterns in a double cut via data storage; and a double cut via replacement module configured to replace the single cut via with the double cut via based on a geometrical environment of the single cut via.

Still another aspect of the present invention inheres in a semiconductor device encompassing a first wire; an interlayer dielectric disposed on the first wire; first and second via plugs buried in the interlayer dielectric connected to the first wire; a second wire disposed on the interlayer dielectric, the second wire oriented obliquely to a longitudinal direction of the first wire and intersects with the first wire where the first via plug is disposed; and a protrusion wire disposed above the interlayer dielectric and connected to the second wire with one end on the second via and another end above the first wire.

BRIEF DESCRIPTION OF DRAWINGS

FIG. 19 shows a sectional view taken on line XIX-XIX in FIG. 20, FIG. 23 is a sectional view taken on line XXIII-XXIII in FIG. 24, FIG. 27 is a sectional view taken on line XXVII-XXVII in FIG. 28.

DETAILED DESCRIPTION OF THE INVENTION

Figure 1:
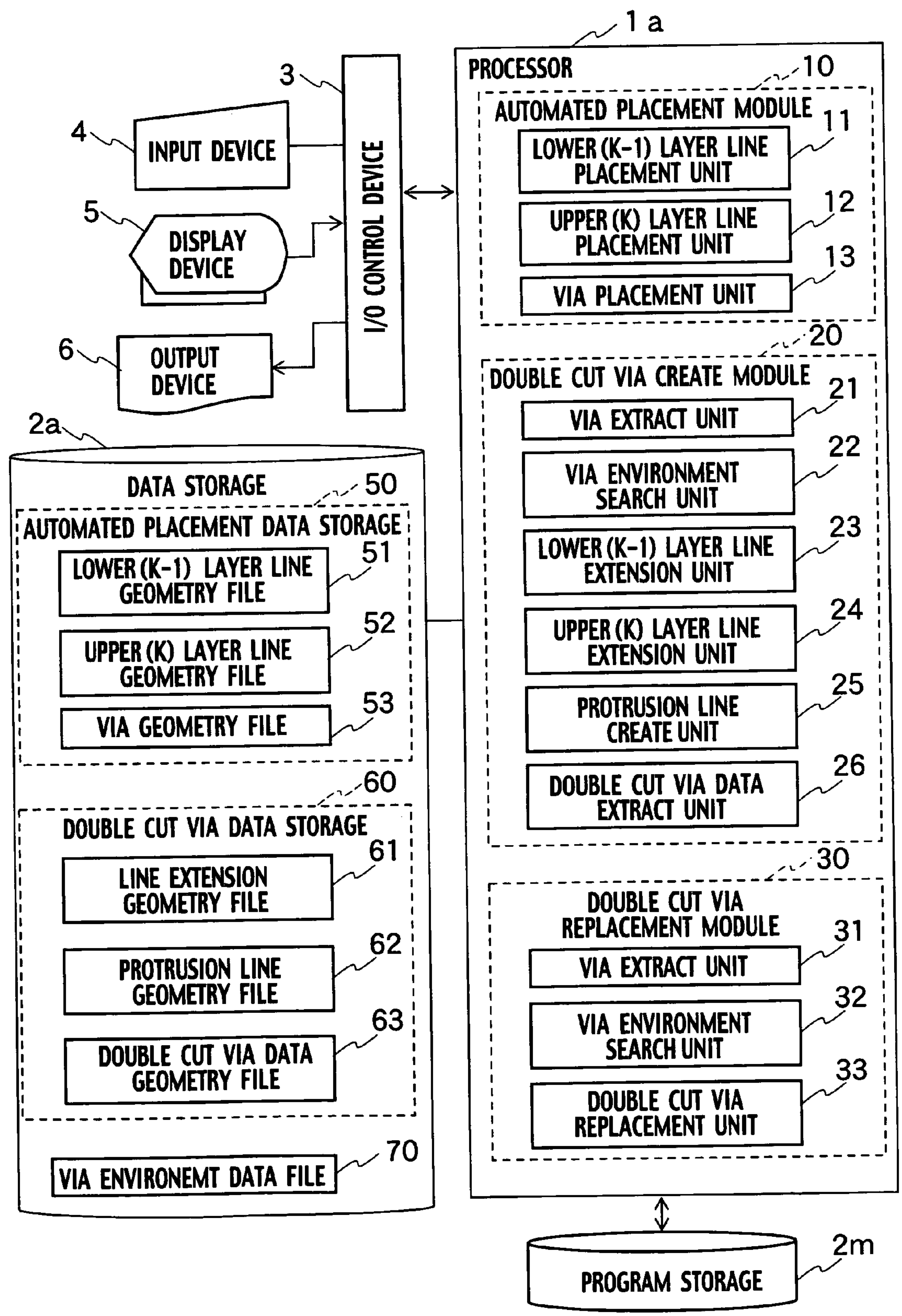
FIG. 1 is a block diagram illustrating an automated design system according to a first embodiment of the present invention.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

In the following descriptions, numerous details are set forth such as specific signal values, etc. to provide a thorough understanding of the present invention. However, it will be obvious to those skilled in the art that the present invention may be practiced without such specific details.

First Embodiment

Automated Design System

As shown in FIG. 1, an automated design system according to the first embodiment of the present invention includes an input device 4, a processor (CPU) 1*a*, a display device 5, an output device 6, a data storage 2*a*, and a program storage 2*m*. The input device 4 permits input of data, instructions and the like from an operator. The display device 5 and the output device 6 display and output layout results and the like. The data storage 2*a* stores predetermined data necessary for layout design of a semiconductor device. The program storage 2*m* stores a layout program of the semiconductor device and the like. The input device 4, the display device 5, and the output device 6 are connected to the CPU 1*a*.

The CPU 1*a* includes an automated placement module 10, a double cut via create module 20, and a double cut via replacement module 30.

The automated placement module 10 places a plurality of circuit layers and a via (hereinafter, referred to as a "single cut via") connected between the circuit layers which are placed above a chip area of a semiconductor IC.

Figure 2:
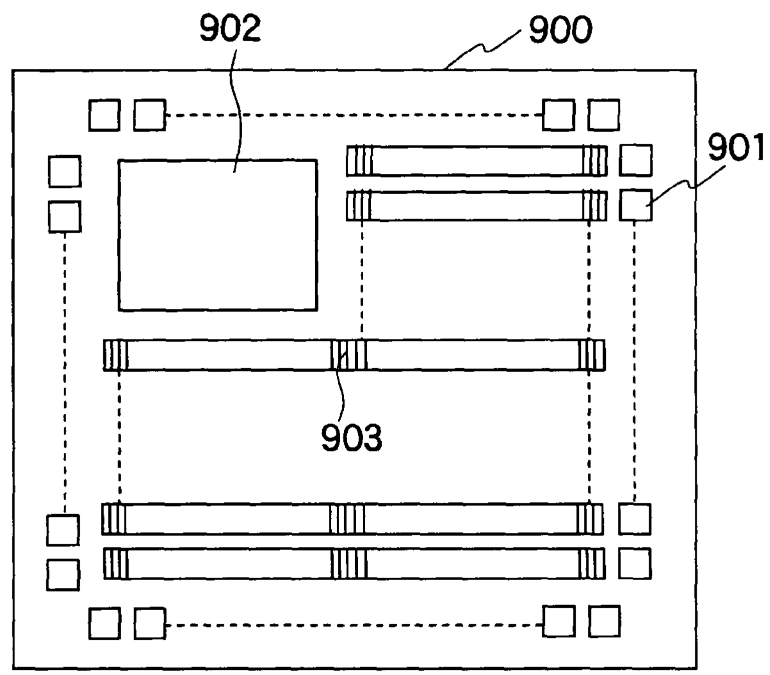
FIG. 2 is a plane view illustrating CAD data of a macro chip designed by the automated design system according to the first embodiment of the present invention.

On the chip area of the semiconductor IC, as shown in FIG. 2, a master chip 900 can be arranged. The master chip 900 has a plurality of I/O cells 901 arranged in an adjacent space of the chip area. A macro cell 902 and a plurality of standard cells 903 are arranged in the area surrounded by the I/O cells 901. The master chip 900 can be automatically positioned by use of a layout program stored in the program storage 2*m*.

Figure 3:
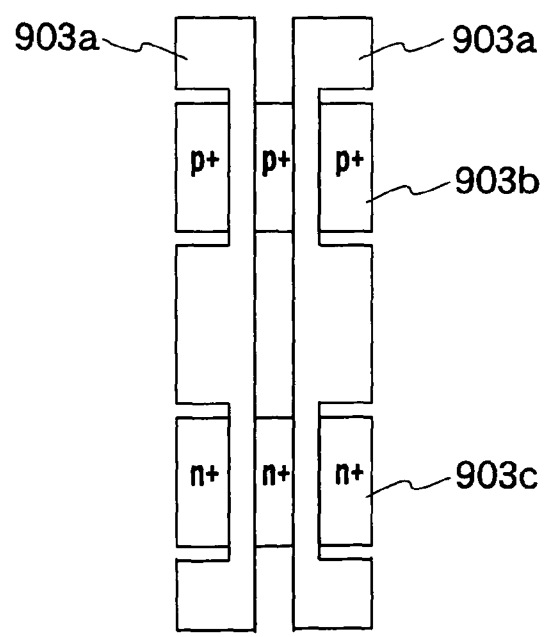
FIG. 3 is a plane view illustrating a structure of a standard cell as shown in FIG. 2.

As shown in FIG. 3, the standard cell 903 may include a gate electrode 903*a*, a p-type semiconductor region 903*b*, and a n-type semiconductor region 903*c*. A p-channel MOSFET can be formed by the p-type semiconductor region 903*b* and the gate electrode 903*a*. A n-channel MOSFET can be formed by the n-type semiconductor region 903*c* and the gate electrode 903*a*.

As shown in FIG. 1, the automated placement module 10 includes a lower (k−1) layer line placement unit 11, an upper (k) layer line placement unit 12, and a via placement unit 13 (here, k indicates two or more arbitrary integers). The lower layer line placement unit 11 places a lower (k−1) layer line pattern 110*a*, as shown in dotted line in FIG. 4, on the layer disposed on the chip area. Herein, the lower (k−1) layer line pattern 110*a* indicates a k−1th layer pattern placed on the chip area.

Figure 4:
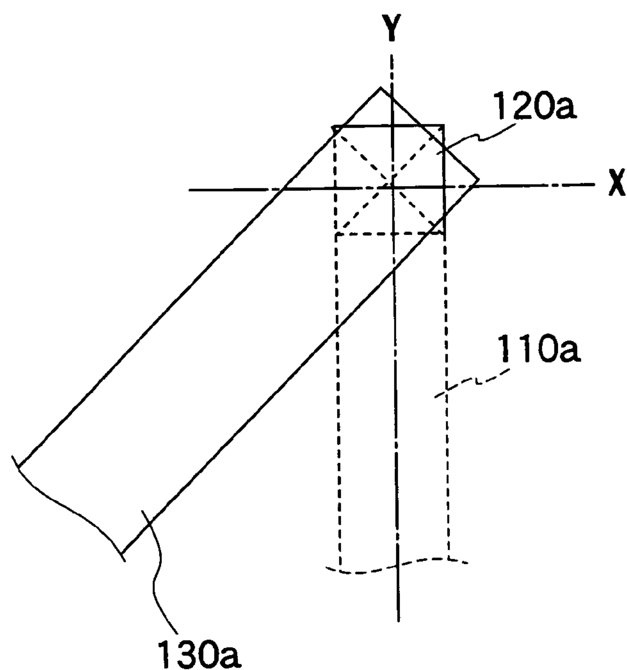
FIG. 4 through FIG. 8 are CAD data illustrating a method of creating a double cut via according to the first embodiment of the present invention.

The upper layer line placement unit 12 places an upper layer line pattern 130*a* on the lower layer line pattern 110*a*, as shown in continuous line in FIG. 4, so that a longitudinal direction of the upper layer line pattern 130*a* intersects obliquely to a longitudinal direction of the lower layer line pattern 110*a*. Herein, the "oblique" indicates a direction at 45 or 135 degrees clockwise from the longitudinal direction of another line.

The via placement unit 13 places a first via pattern 120*a* on an intersection of the lower layer line pattern 110*a* and the upper layer line pattern 130*a* as shown in dotted line in FIG. 4.

The double cut via create module 20 includes a via extract unit 21, a via environment search unit 22, and a lower (k−1) layer line extension unit 23, an upper (k) layer line extension unit 24, a protrusion line create unit 25, and a double cut via data extract unit 26. The via extract unit 21 extracts the first via pattern 120*a* from CAD data as shown in FIG. 4. The via environment search unit 22 searches a geometrical environment such as line patterns and via patterns existing around the first via pattern 120*a*.

Figure 5:
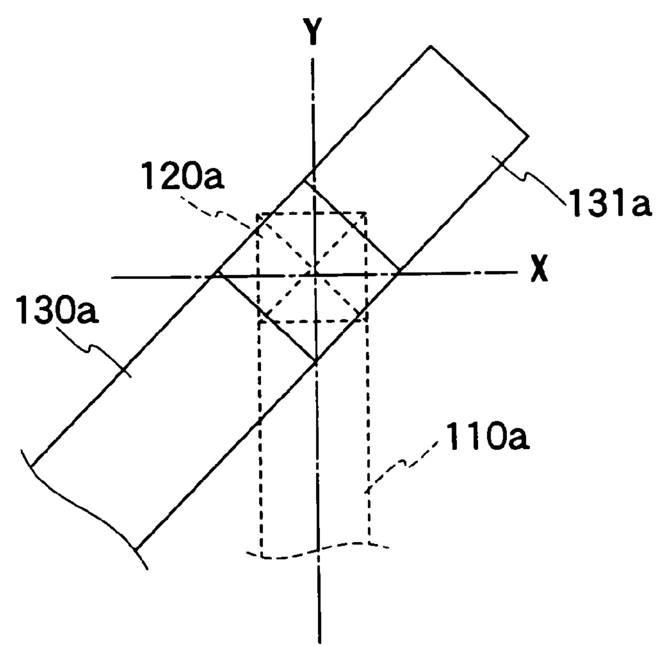

As shown in FIG. 5, the upper (k) layer line extension unit 24 extends a line length of the upper layer line pattern 130*a* from an intersection of the lower layer line pattern 110*a* and the upper layer line pattern 130*a*, and creates a line extension pattern 131*a* extending from the intersection of the lower layer line pattern 110*a* and the upper layer line pattern 130*a*, depending on a geometrical environment of the first via pattern 120*a*, which is placed on the intersection. The line extension pattern 131*a* has a predetermined length in the longitudinal direction of the upper layer line pattern 130*a* and has the same line width as the upper layer line pattern 130*a*.

Figure 6:
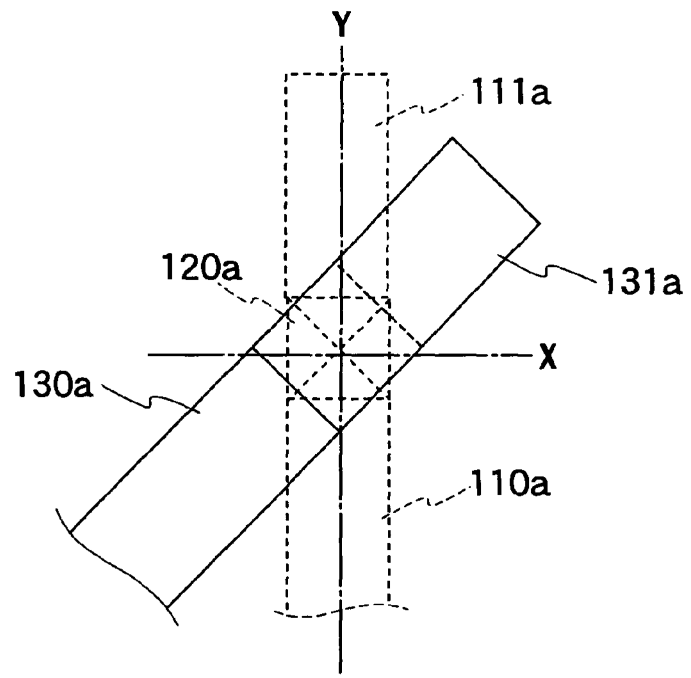

As shown in FIG. 6, the lower layer line extension unit 23 extends a line length of the lower layer line pattern 110*a* in a longitudinal direction of the lower layer line pattern 110*a* from an intersection of the lower layer line pattern 110*a* and the upper layer line pattern 130*a*, and creates a line extension pattern 111*a* having a predetermined length in the longitudinal direction of the lower layer line pattern 110*a* and having the same line width as the lower layer line pattern 110*a*.

Figure 7:
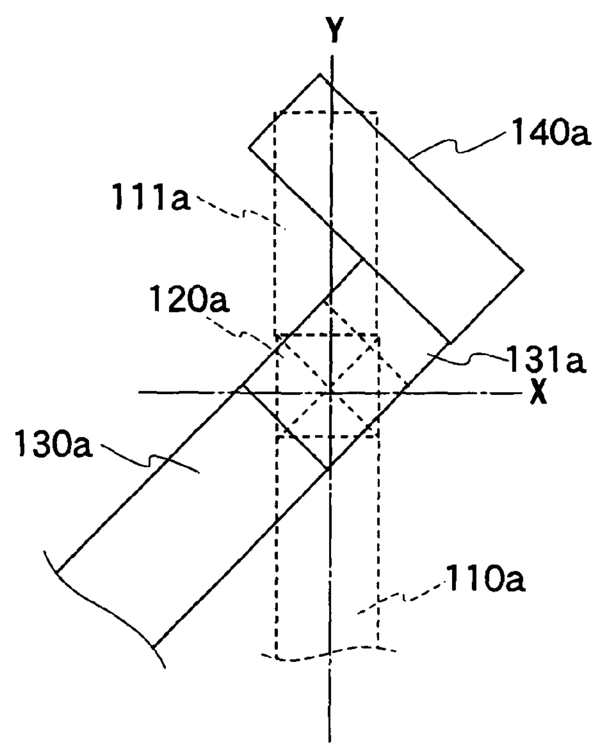

As shown in FIG. 7, the protrusion line create unit 25 creates a protrusion line pattern 140*a* connected to an end portion of the line extension pattern 131*a*. The protrusion line pattern 140*a* oriented perpendicular to the longitudinal direction of the upper layer line pattern 130*a*. The protrusion line pattern 140*a* is overlapped with an end of the line extension pattern 111*a*.

Figure 8:
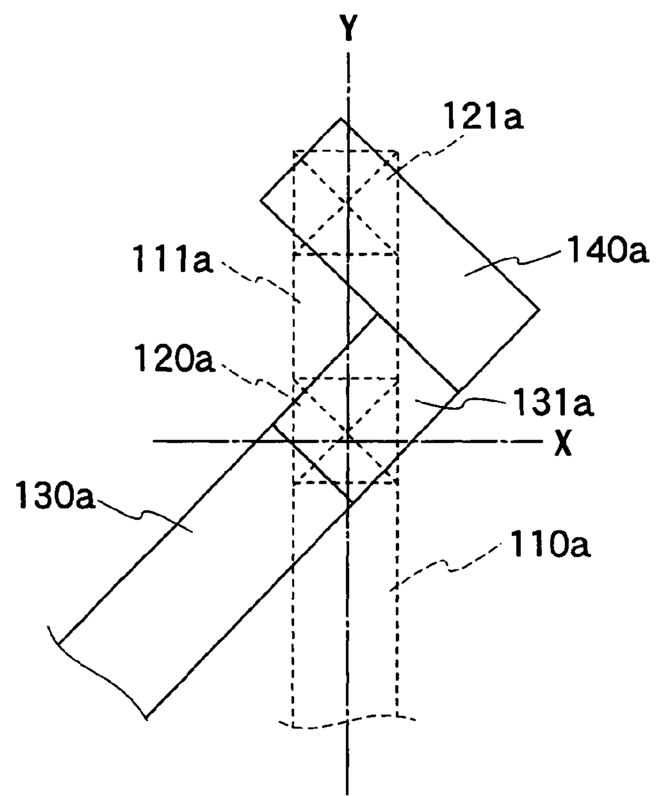

As shown in FIG. 8, the double cut via data extract unit 26 creates a second via pattern 121*a* to interconnect with the line extension pattern 111*a* and the protrusion line pattern 140*a*. Then, the double cut via data extract unit 26 extracts data of a double cut via 150*a* structure including the line extension pattern 111*a*, line extension pattern 131*a*, protrusion line pattern 140*a*, and first and second via patterns 120*a* and 121*a*. Herein, the "double cut via" indicates a via structure having two vias placed between two layers. The "single cut via" indicates a via structure having one via placed between two layers. Moreover, the double cut via data extract unit 26 also extracts location information of grid lines X and Y placed on the center of the first via pattern 120*a* in addition to the data of the geometrical data of the double cut via 150*a*. The double cut via extract unit 26 links the location information of grid lines X and Y to the first via pattern 120*a* of the double cut via 150*a*.

As shown in FIG. 1, the double cut via replacement module 30 includes a via extract unit 31, a via environment search unit 32, and a double cut via replacement unit 33. The via extract unit 31 extracts a layout having a single cut via (the first via pattern 120*a*) allocated by the automated placement module 10 as shown in FIG. 4. Then, the via extract unit 31 extracts the first via pattern 120*a* and location information of the grid lines X and Y. The via environment search unit 32 searches data of the geometrical environment, such as line patterns existing around the first via pattern 120*a*. The double cut via replacement unit 33 replaces an optimal double cut via stored in the double cut via geometry storage 60 based on the data searched by the via environment search unit 32 and location information of the grid lines X and Y.

Figure 9:
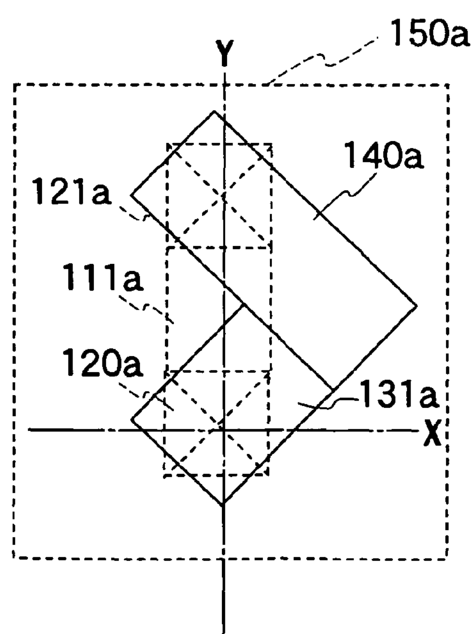
FIG. 9 is CAD data of a double cut via created by the automated design system according to the first embodiment of the present invention.

Here, the "optimal double cut via" indicates a double cut via having secured spaces determined by a design rule between line spaces and via sides. For example, in a layout as shown in FIG. 4, the double cut via replacement unit 33 selects the double cut via 150*a* as shown in FIG. 9, which is the most appropriate geometry for the layout in FIG. 4. Then the double cut via replacement unit 33 replaces the first via pattern 120*a* with the double cut via 150*a*.

The data storage 2*a* includes an automated placement data storage 50, a double cut via design storage 60, and a via environment data file 70. The automated placement data storage 50 stores data to interconnect lines and vias. The double cut via design storage 60 stores data to design the double cut via 150*a* on a layout. The via environment data file 70 stores geometrical environment of the first via pattern 120*a* and the like extracted from the designed layout.

The automated placement data storage 50 further includes a lower (k−1) layer line geometry file 51, an upper (k) layer line geometry file 52, and a via data geometry file 53. The lower (k−1) layer line geometry file 51 stores data of shapes and sizes of the lower layer line patterns placed by the automated placement module 10. The upper (k) layer line geometry file 52 stores data of shapes and sizes of the upper layer line patterns. The via data geometry file 53 stores data of shapes and size of the vias to position the first via pattern 120*a* and second via pattern 121*a*.

The double cut via design storage 60 includes a line extension geometry file 61, a protrusion line geometry file 62, and a double cut via geometry file 63. The line extension geometry file 61 stores to file data of shapes and sizes of line extension geometries such as the line extension patterns 111*a* and 131*a*. The protrusion line geometry file 62 stores to file data of shapes and sizes of protrusion line patterns such as the protrusion line pattern 140*a*. The double cut via geometry file 63 stores to file geometrical data of the double cut via 150*a* including the first via pattern 120*a* and second via pattern 121*a*.

The input device 4 as shown in FIG. 1, includes a keyboard, a mouse, a light pen, a flexible disk, and the like. The operator can input data for automated placement through the input device 4. It is also possible to input installation of a layout parameter, calculations, cancellation or the like. The display device 5 displays input and output data, layout results and the like. The program storage 2*m* stores data such as input and output data, layout parameters, and data in the course of operations.

According to the automated design system of the first embodiment of the present invention, as shown in FIG. 8, the protrusion line pattern 140*a* having the same line width as the upper layer line pattern 130*a* and the line extension pattern 131*a* may be placed perpendicular to the longitudinal direction of the upper layer line pattern 130*a* and the line extension pattern 131*a*. Therefore, line patterns 110*a* and 130*a* intersect obliquely and arranged on different layer can be connected with a plurality of vias 120*a* and 121*a* without enlarging line widths.

Since the line widths in the layout designed by the automated design system as shown in FIG. 1 are uniform, it is easy to manufacture a mask as designed, compared to the case where the line widths are varied. The manufacturing yield of the semiconductor IC may be increased by interconnecting layers with a plurality of vias compared to the case where the layers are interconnected with a single via.

Moreover, the double cut via create module 20 as shown in FIG. 1 creates different shapes of double cut vias and stores the different shapes in the double cut via geometry file 63 of the data storage 2*a*. When replacing a single cut via with the double cut via, an optimal double cut via having appropriate shapes may be extracted based on the data of the geometrical environment and location information of the grid lines X and Y. Therefore, the time required to execute automated placement will be shortened.

Computer Implemented Method for Designing a Semiconductor IC

Next, a description will be given of a computer implemented method for designing a semiconductor IC according to the first embodiment of the present invention with reference to flowcharts of FIGS. 10 and 11.

Figure 10:
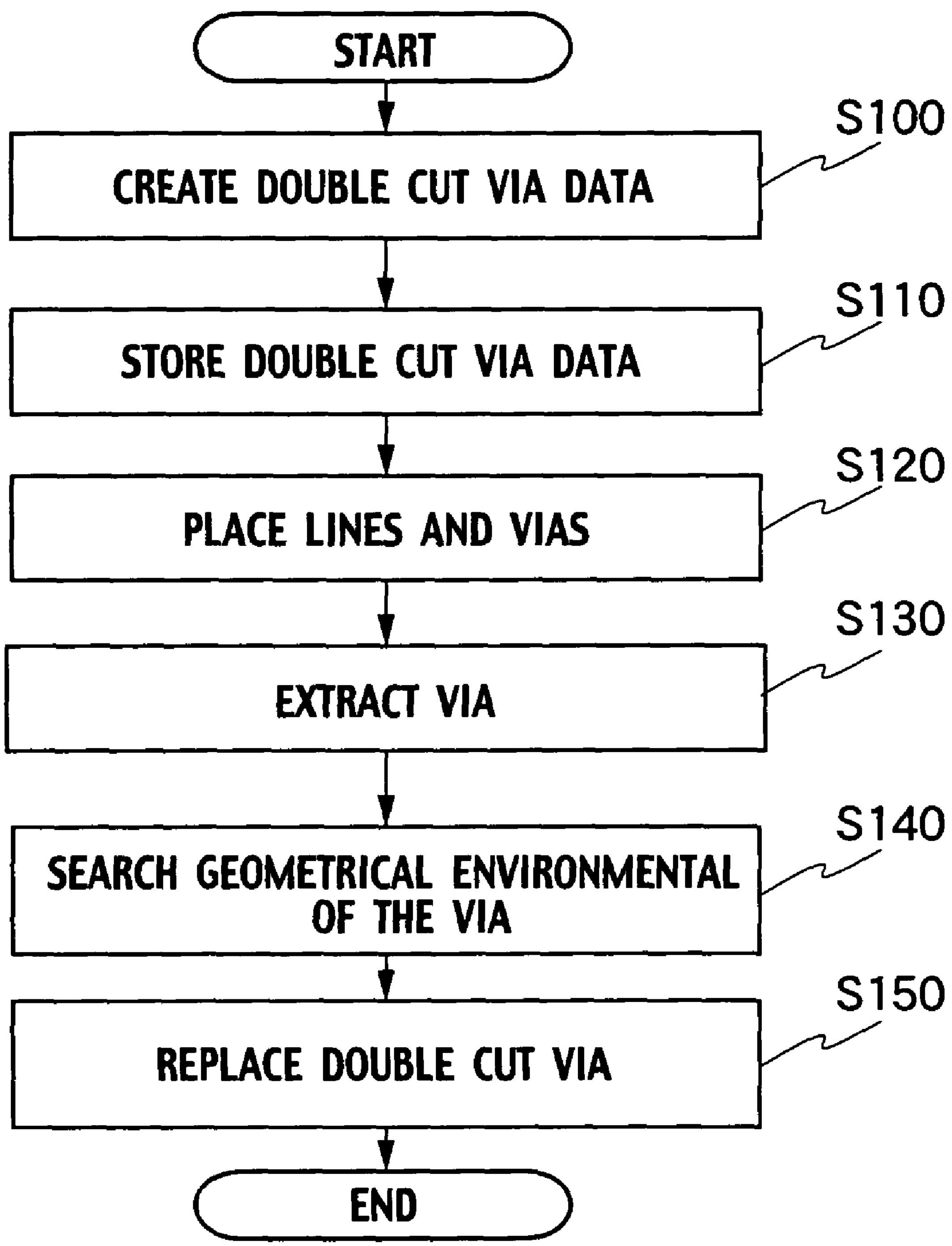
FIG. 10 and FIG. 11 are flowcharts illustrating the method for designing a semiconductor device according to the first embodiment of the present invention.

In a step S100 in FIG. 10, the double cut via create module 20 as shown in FIG. 1 creates a data file to replace a single cut via with the double cut via based on the data stored in the double cut via design storage 60. Detailed description in step S100 will be given according to the later described flowchart as shown in FIG. 11. In a step 110, the data of the double cut via 150*a* created by the double cut via create module 20 is stored in the double cut via geometry file 63.

As shown in FIG. 2, the master chip 900 having the I/O cell 901, macro cell 902, and standard cell 903 or the like is automatically placed based on the layout program stored in the program storage 2*m*. In a step 120, as shown in FIG. 4, the lower layer line placement unit 11 automatically places the lower layer line pattern 110*a* on the chip area. The upper layer line placement unit 12 automatically places the upper layer line pattern 130*a* extending in a direction at 45 degrees clockwise to the longitudinal direction of the lower layer line pattern 110*a*. The via placement unit 13 allocates the first via pattern 120*a* on the intersection of the lower layer line pattern 110*a* and the upper layer line pattern 130*a*.

In a step 130, the via extract unit 31 extracts the first via pattern 120*a* in a layout having the lower layer line pattern 110*a*, the upper layer line pattern 130*a*, and the first via pattern 120*a* as shown in FIG. 4. In a step S140, the via environment search unit 32 extracts geometrical data such as lines and vias and the like surrounding the first via pattern 120*a*. For example, in FIG. 4, the via environment search unit 32 extracts data showing that there is no adjacent line pattern around the first via pattern 120*a* except for the upper and lower layer line pattern 110*a* and 130*a*. The via environment search unit 32 also stores extracted data in the via environment data file 70. In this event, the via environment search unit 32 also searches location information of the grid lines X and Y provided on the center of the first via pattern 120*a*.

In a step S150, the double cut via replacement unit 33 extracts an optimal double cut via from the double cut via geometry file 63 to replace the first via pattern with a new double cut via. For example, in the case where the first via pattern 120*a* as shown in FIG. 4 is replaced, the double cut via replacement unit 33 extracts the double cut via 150*a* as shown in FIG. 9 as the optimal double cut via. Then, the double cut via replacement unit 33 replaces the first via pattern 120*a* with the double cut via 150*a* by superposing grid lines X and Y included in the double cut via data to the grid lines X and Y on the layout in FIG. 4.

A detailed description will be given of a method of creating the double cut via file in the step S100 by using the flowchart of FIG. 11.

Figure 11:
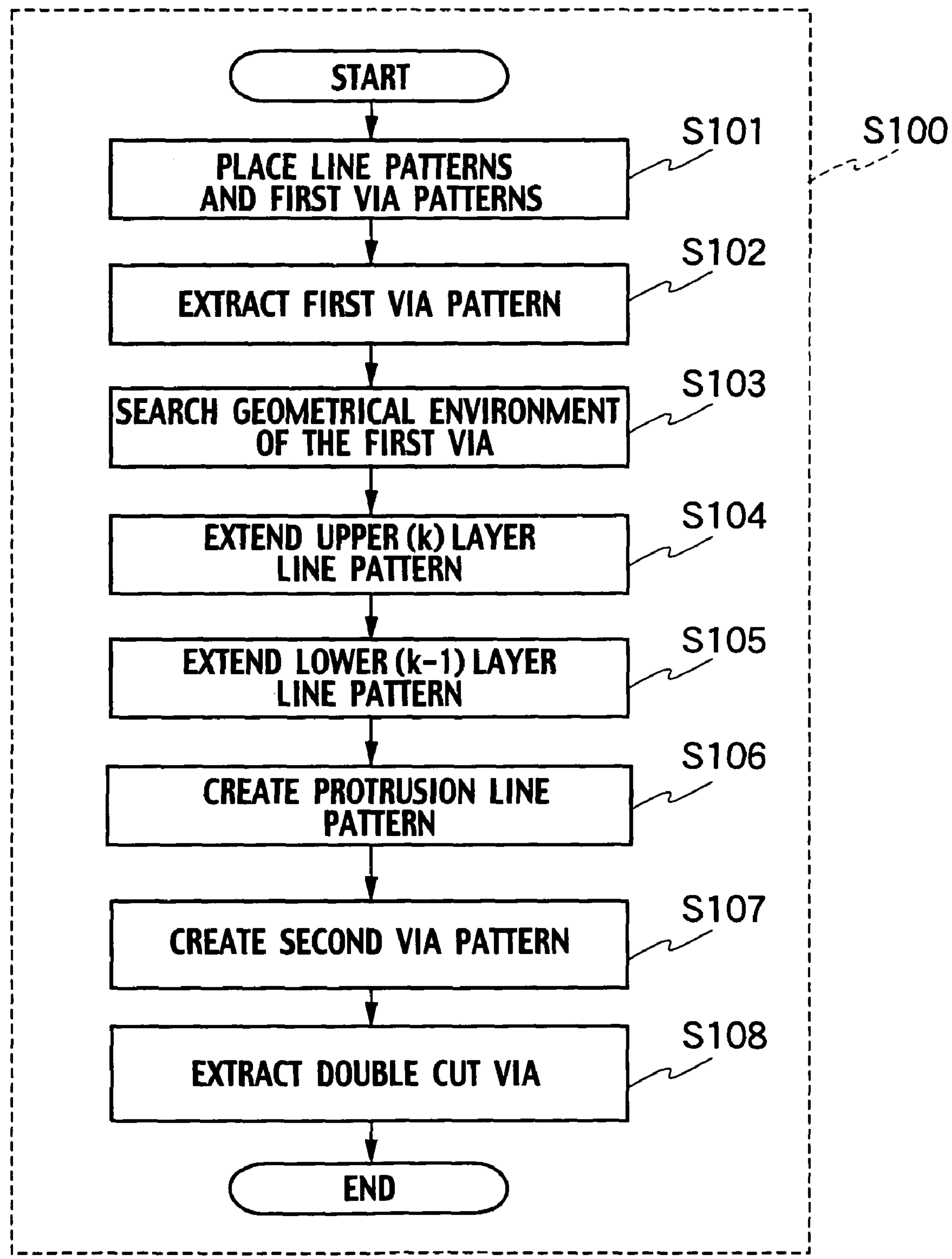

In a step S101 in FIG. 11, the lower layer line placement unit 11 automatically places the lower layer line pattern 110*a* on the chip area in the memory storage of the automated design system. As shown in FIG. 4, the upper layer line placement unit 12 automatically places the upper layer line pattern 130*a* on the lower layer line pattern 110*a* so that the longitudinal direction of the second line pattern 130*a* intersects obliquely to the longitudinal direction of the first line pattern 110*a*. The via placement unit 13 automatically places the first via pattern 120*a* on the intersection of the lower layer line pattern 110*a* and the upper layer line pattern 130*a*.

In a step S102, as shown in FIG. 4, the via extract unit 21 extracts the first via pattern 120*a* allocated on the intersection of the lower layer line pattern 110*a* and the upper layer line pattern 130*a*. In a step S103, the via environment search unit 22 searches geometrical environment such as line patterns adjacent to the first via pattern 120*a* and location information of the grid lines X and Y on the layout, and stores the geometrical environment and location information in the via environment data file 70.

In a step S104, as shown in FIG. 5, the upper layer line extension unit 24 creates the line extension pattern 131*a* which extends in the same direction as the longitudinal direction of the upper layer line pattern 130*a* from the end portion of the upper layer line pattern 130*a*, based on the wire extension data stored in the line extension geometry file 61 and the via geometrical environment stored in the via environment data file 70. In a step S105, as shown in FIG. 6, the lower layer line extension unit 23 creates the line extension pattern 111*a* having the same line widths as the lower layer line pattern 110*a* and extending in the same direction as the longitudinal direction of the lower layer line pattern 110*a* from the end portion of the lower layer line pattern 110*a*, based on the wire extension data stored in the line extension geometry file 61 and the geometrical environment stored in the via environment data file 70.

In a step S106, as shown in FIG. 7, the protrusion line create unit 25 creates the protrusion line pattern 140*a* having the same line width as the upper layer line pattern 130*a* and having the longitudinal direction perpendicular to the longitudinal direction of the upper layer line pattern 130*a* based on the protrusion line data stored in the protrusion line geometry file 62 and the geometrical environment stored in the via environment data file 70. In addition, the size of the protrusion line pattern 140*a* can be set by storing size data in the protrusion line geometry file 62. In a step S107, the double cut via data extract unit 26 as shown in FIG. 8, creates the second via pattern 121*a* on an end portion of the protrusion line pattern 140*a* to connect with line extension pattern 131*a* and the line extension pattern 111*a*.

In a step S108, as shown in FIG. 9, the double cut via data extract unit 26, extracts the double cut via 150*a* including the first via pattern 120*a*, the second via pattern 121*a*, the line extension patterns 111*a* and 131*a*, and the protrusion line pattern 140*a*. The double cut via data extract unit 26 stores data of the extracted double cut via 150*a* in the double cut via geometry file 63. The double cut via data extract unit 26 also extracts location information of grid lines X and Y intersecting on the center of the first via pattern 120*a* and links the information with the data of the double cut via 150*a*. In such a way, various types of double cut vias are created according to the steps S101 through S108 to replace all single cut via patterns.

The computer implemented method for designing the semiconductor device according to the first embodiment, permits the placement of vias when a plurality of layers are interconnected with a plurality of vias, and the protrusion line pattern 140*a* have the same line width as other lines. Therefore, a plurality of vias (for example, first and second via patterns 120*a* and 121*a*) can be positioned without enlarging widths of the lines.

Since the widths of lines in the layout designed by the automated design system as shown in FIG. 1 are uniform, it becomes easy to manufacture a designed wires compared to the case where the width of lines are varied. In addition, the manufacturing yield of the semiconductor IC will be increased by connecting circuit layers with a plurality of vias compared to the case where the layers are connected with a single via. Further, since the protrusion line pattern 140*a* is placed only on one layer, it is possible to place another line pattern adjacent to another layer. Therefore, the density of lines will be increased.

Moreover, the double cut via create module 20 as shown in FIG. 1 creates all data of the double cut vias that are deployable on the layout, and stores the data in the double cut via geometry file 63 of the data storage 2*a*. When replacing a single cut via in a layout with the double cut via, appropriate shapes of the double cut via stored in the double cut via geometry storage 60 may be extracted and replaced. Therefore, the time for executing automated placement will be shortened.

Reticle Set

Figure 12:
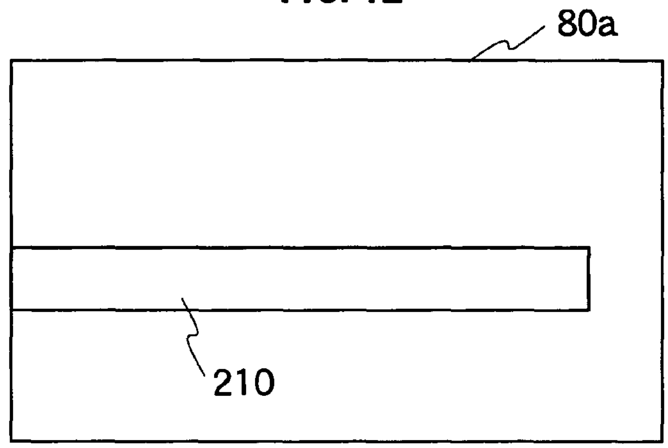
FIG. 12 is a plane view illustrating a first reticle of a reticle set according to the first embodiment of the present invention.
Figure 13:
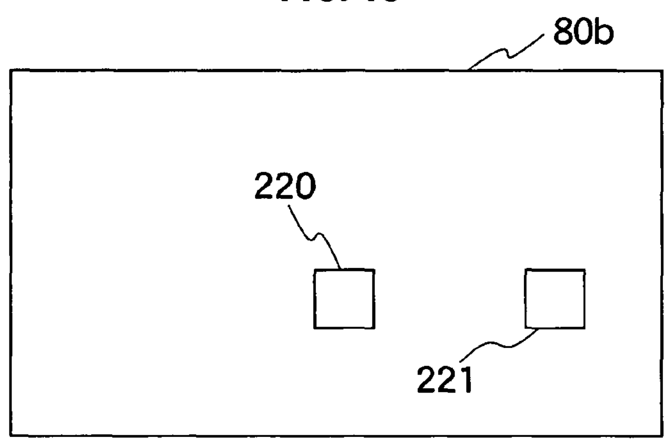
FIG. 13 is a plane view illustrating a second reticle of the reticle set according to the first embodiment of the present invention.
Figure 14:
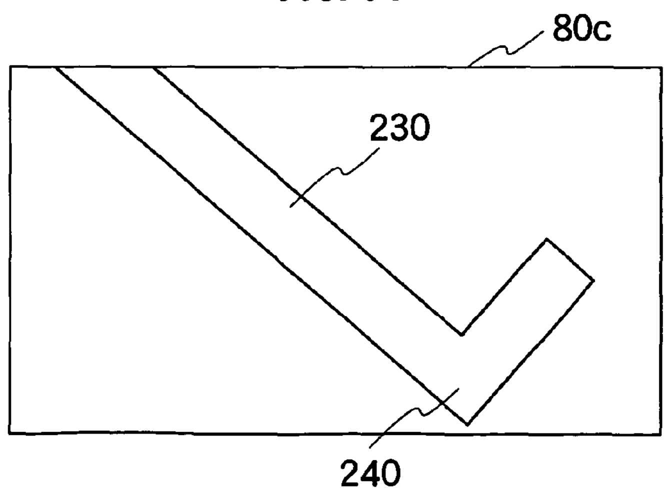
FIG. 14 is a plane view illustrating a third reticle of the reticle set according to the first embodiment of the present invention.

An example of a reticle set according to the first embodiment is illustrated in FIGS. 12 to 14. The reticle set as shown in FIGS. 12 to 14 can be manufactured by a pattern generator or the like based on the CAD data obtained by the automated design system as shown in FIG. 1.

The reticle set includes a first reticle (k−1th layer reticle) 80*a*, a second reticle (kth layer reticle) 80*b* which is projected to be aligned with a projected image of the first reticle 80*a*, and a third reticle (k+1th layer reticle) 80*c* projected to be aligned with a pattern formed by the projected images of the first and second reticles 80*a* and 80*b*, respectively. FIGS. 12 to 14 only show three reticles out of the reticle set, which may include more than ten reticles.

Figure 15:
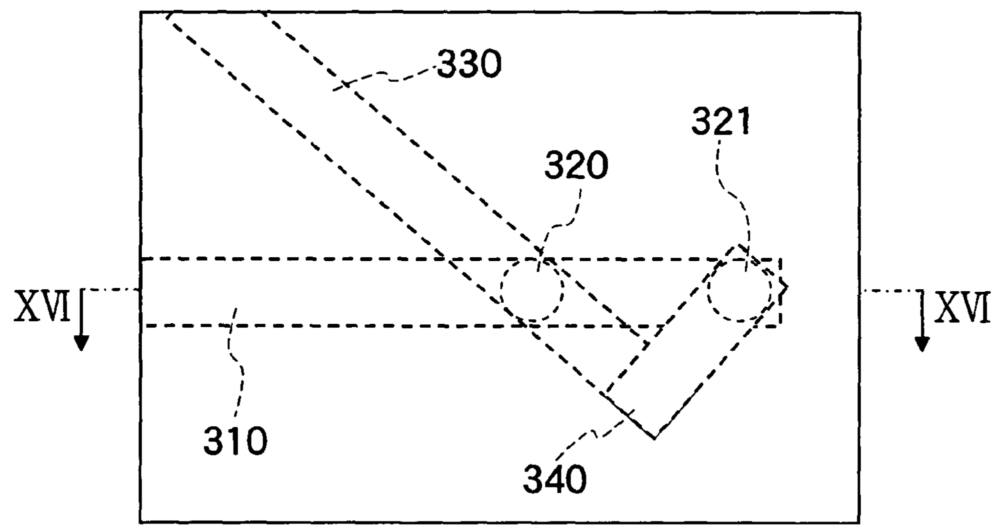
FIG. 15 is a plane view illustrating a semiconductor device according to the first embodiment of the present invention.

In the first reticle 80*a*, a lower (k−1) layer line pattern 210 for drawing a lower (k−1) layer wire 310 as shown in FIG. 15 in the semiconductor IC is arranged on a quartz mask substrate or the like. The lower (k−1) layer line pattern 210 is formed as a pattern of an opaque film of chrome (Cr), chrome oxide ($Cr_2O_3$) or the like. A pattern composed of such an opaque film can be formed by drawing a pattern in a photoresist formed on the opaque film by a pattern generator such as an electron beam lithography apparatus and etching the opaque film by RIE using the photoresist pattern as a mask.

In the second reticle 80*b*, a first via pattern 220 and a second via pattern 221 are arranged on a quartz mask substrate or the like as an opaque film. In the third reticle 80*c*, an upper (k) layer line pattern 230 and a protrusion line pattern 240 for drawing an upper (k) layer wire 330 as shown in FIG. 15 are arranged on a mask quartz substrate or the like as an opaque film.

According to the reticle set as shown in FIGS. 12 to 14, the lower layer line pattern 210 and the upper layer line pattern 230 which is oriented oblique to the longitudinal direction of the lower layer line pattern 210 are connected with two vias (the first and second via patterns 220 and 221). Therefore, the reliability of the device will be increased as compared to the case where the layers are connected with a single via.

In addition, the protrusion line pattern 240 may be formed adjacent to only one of the lower layer line pattern 210 and the upper layer line pattern 230, depending on the geometrical environment. Therefore, the protrusion line pattern 240 does not obstruct other wires arranged in adjacent areas, and wire density of the semiconductor IC may be increased. Moreover, since the protrusion line pattern 240 having the same line width as other line patterns is formed to protrude perpendicular to the longitudinal direction of the upper layer line pattern 230, wires of the semiconductor IC can be manufactured as designed, as compared to the case where wires have varied widths.

Semiconductor Device

Figure 16:
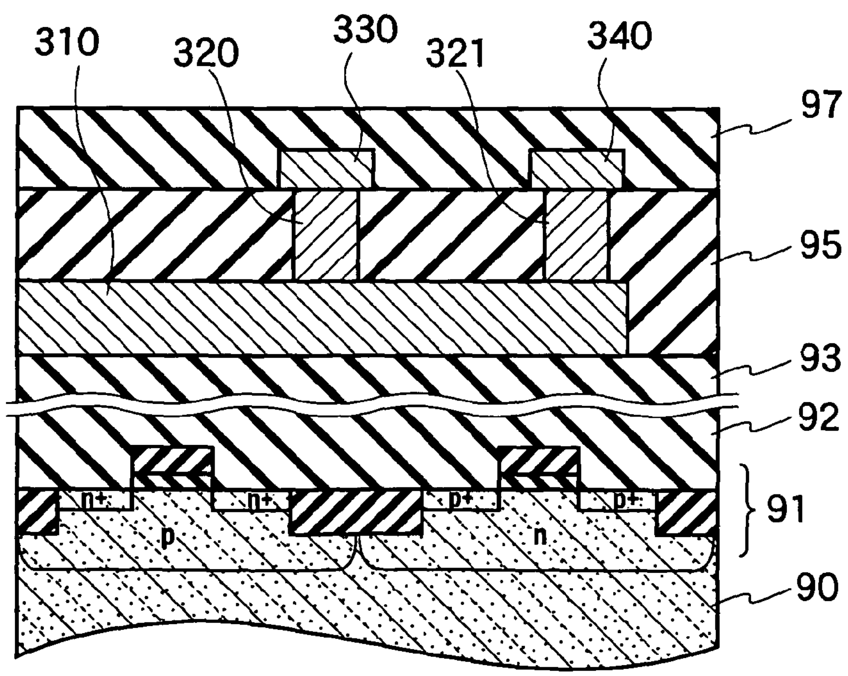
FIG. 16 is a sectional view illustrating the semiconductor device taken on line XVI-XVI in FIG. 15.

FIGS. 15 and 16 show an example of a multi-level interconnect structure of the semiconductor IC according to the first embodiment of the present invention. FIG. 16 shows an example of a cross-sectional view taken on line in XVI-XVI of FIG. 15.

As shown in FIG. 16, the semiconductor IC includes a semiconductor substrate 90 with a semiconductor element 91 in the isolation region, and a first interlayer dielectric 92 deposited on the semiconductor substrate 90. Herein, the first interlayer dielectric 92 refers to a (k−2)-th interlayer dielectric film (k≧3).

A (k−1)-th interlayer dielectric 93 is arranged on the first interlayer dielectric 92. The lower (k−1) layer wire 310 is arranged on the (k−1)-th interlayer dielectric 93. The lower layer wire 310 can be formed by delineating a metal film of aluminum (Al), aluminum alloy, copper (Cu), or the like by photolithography and RIE by using the first reticle 80*a* as shown in FIG. 12.

On the (k−1)-th interlayer dielectric 93 and the lower layer wire 310, a k-th interlayer dielectric 95 is arranged. On the k-th interlayer dielectric 95, a protrusion wire 340 connected to the upper (k) layer wire 330 is arranged. As shown in FIG. 15, the upper layer wire 330 extends 45 degrees clockwise in the longitudinal direction of the lower layer wire 310. The protrusion wire 340 having the same wire width as the upper layer wire 330 is connected to the end portion of the upper layer wire 330. The protrusion wire 340 has a longitudinal direction perpendicular to the longitudinal direction of the upper layer wire 330. The upper layer wire 330 and the protrusion wire 340 can be formed by delineating a metal film of Al, Al alloy, Cu, or the like by photolithography and RIE by using the third reticle 80*c* as shown in FIG. 14.

First and second via plugs 320, 321 connecting the lower layer wire 310 and the upper layer wire 330 are arranged in the k-th interlayer dielectric 95. As shown in FIG. 15, the first via plug 320 is arranged on the intersection of the protrusion wire 340 and the lower layer wire 310. The first and second via plugs 320, 321 can be formed by delineating a metal film of aluminum (Al), aluminum alloy, copper (Cu) or the like by photolithography and RIE by using the second reticle 80*b* as shown in FIG. 13.

According to the semiconductor IC of the first embodiment of the present invention, when the upper and lower wires crossing obliquely in different layers are connected with a plurality of via plugs, the protrusion wire 340 having the same wire width as other wires may be placed perpendicular to the longitudinal direction of the wire. Therefore, the wires of the semiconductor IC can be manufactured as designed on the mask, as compared with a mask having various shapes and sizes. Moreover, since two wire layers are interconnected with two via plugs, an increase in resistance caused by defective via plugs may be prevented. A decreased yield caused by disconnection of wires may also be prevented. Since the protrusion wire 340 is placed on one layer, it is possible to place another wires on the other layer. Therefore, the degree of wiring integration of the semiconductor IC will be increased.

Method for Manufacturing a Semiconductor IC

A method for manufacturing a semiconductor IC according to the first embodiment will be described. The described method is one example. Thus, it is needless to say that the present invention can be achieved by use of various other manufacturing methods, including a modified example of the method described below.

Figure 17:
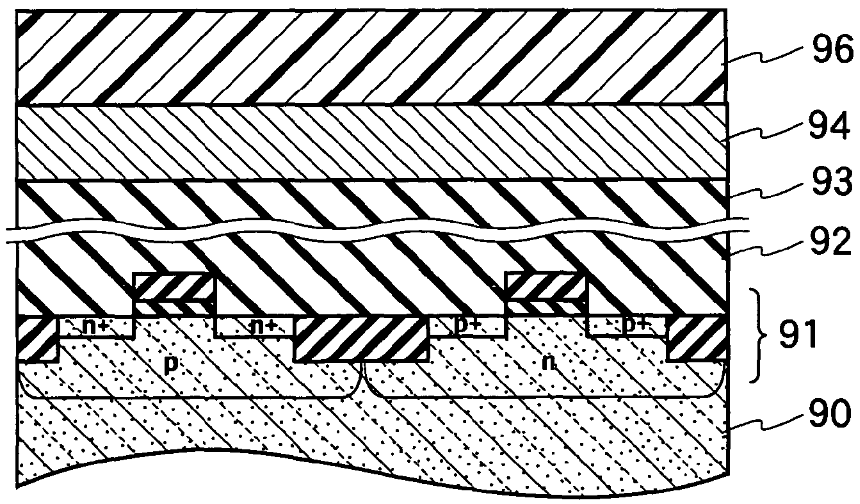
FIG. 17 through FIG. 27 are sectional views illustrating a method of manufacturing a semiconductor device according to the first embodiment of the present invention.

As shown in FIG. 17, the first interlayer dielectric 92, such as a silicon dioxide film ($SiO_2$ film), is deposited by chemical vapor deposition (CVD), physical vapor deposition (PVD), and the like, on the semiconductor substrate 90 with the isolation element 91 formed in the isolation region. A surface of the first interlayer dielectric 92 is planarized by chemical mechanical polishing (CMP). A conductive thin film 94 is deposited on the (k−1)-th interlayer dielectric 93, and the conductive thin film 94 is planarized. A photoresist film 96 is applied on the conductive thin film 94.

Figure 18:
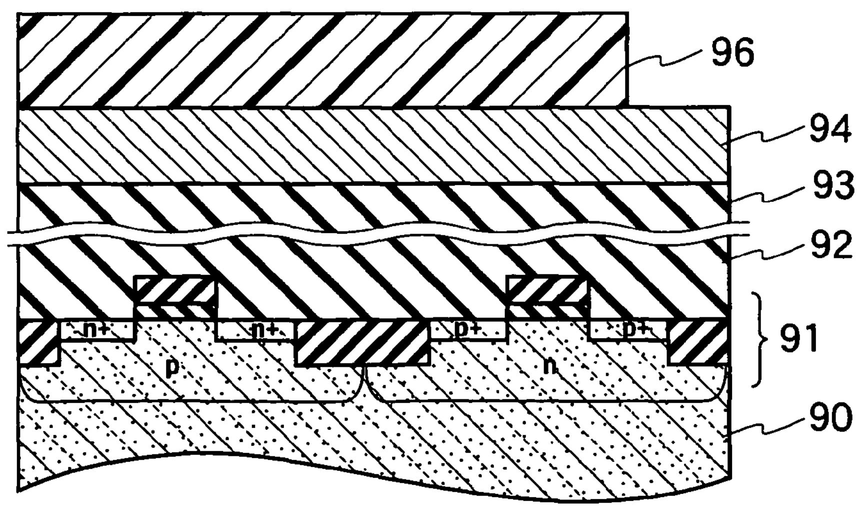
Figure 19:
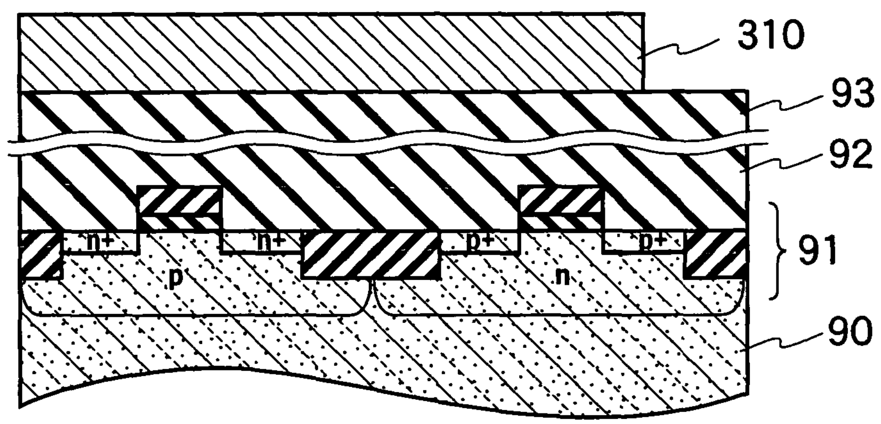
Figure 20:
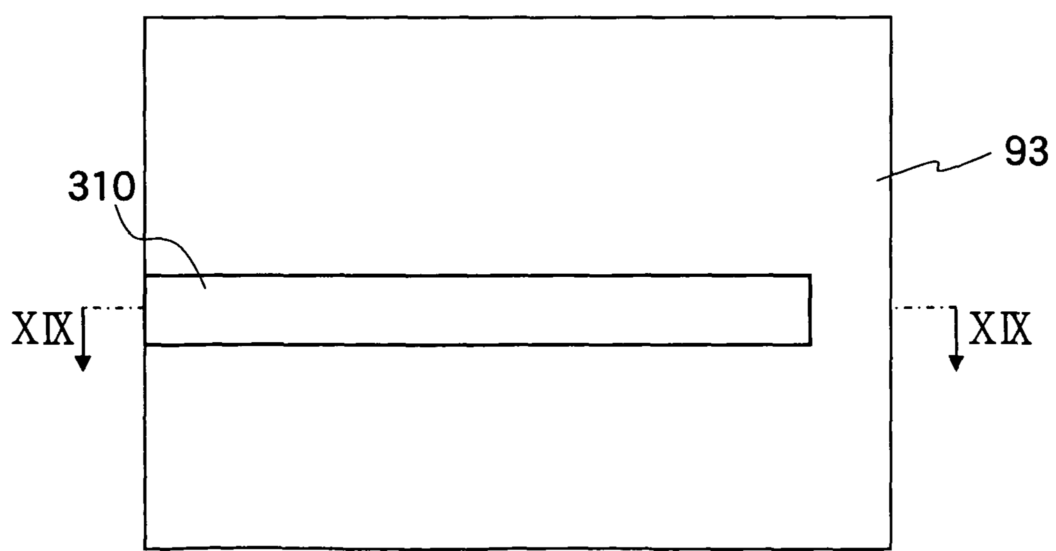

The semiconductor substrate 90 as shown in FIG. 17 is placed on an exposure stage of a reduction projection aligner (stepper) or the like, and photoresist film 96 is exposed and developed by using the first reticle 80*a* as shown in FIG. 12. As shown in FIG. 18, the photoresist film 96 is delineated on the conductive thin film 94. The conductive thin film 94 is selectively stripped by using the delineated photoresist film 96 as a mask. Then, the photoresist film 96 is removed. Consequently, as shown in FIGS. 19 and 20, the lower (k−1) layer wire 310 is formed on the (k−1)-th interlayer dielectric 93.

Figure 21:
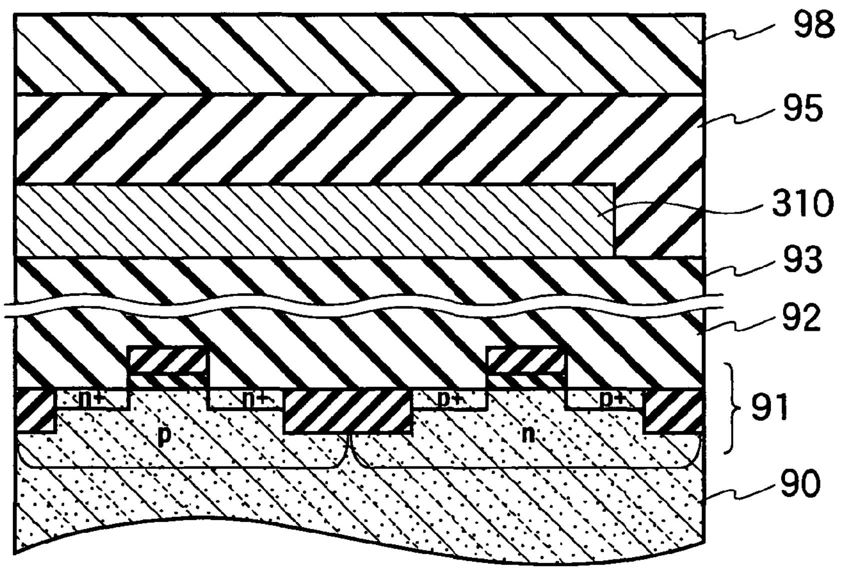
Figure 22:
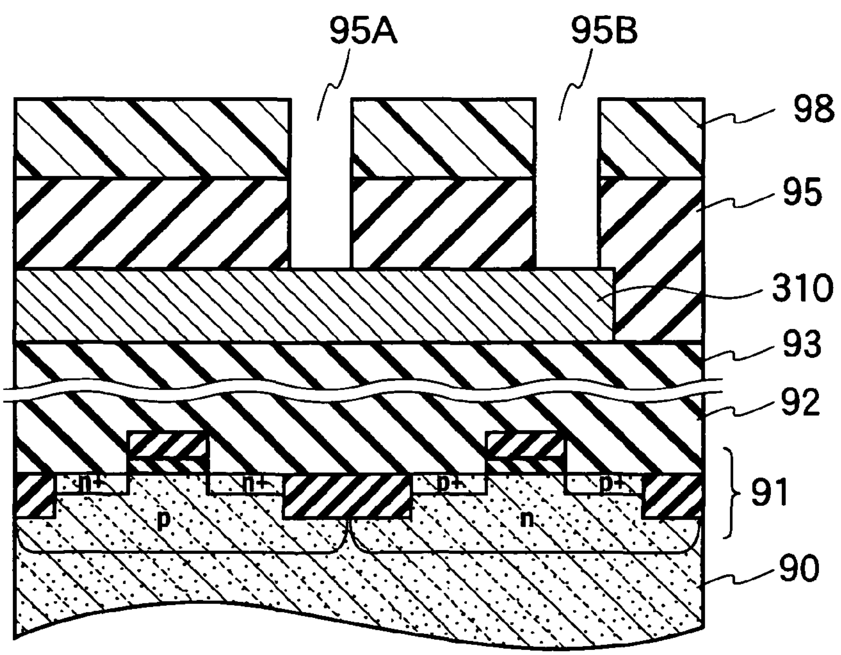
Figure 23:
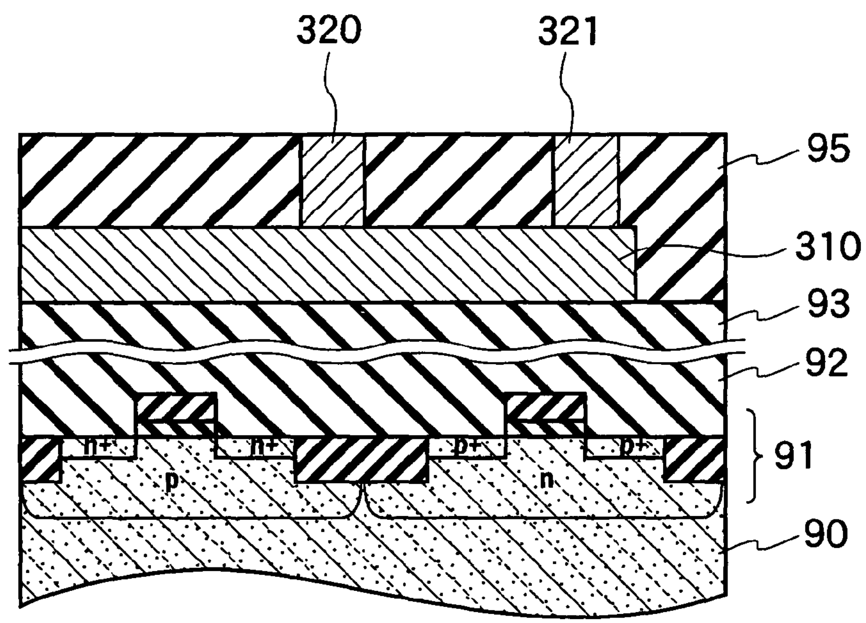
Figure 24:
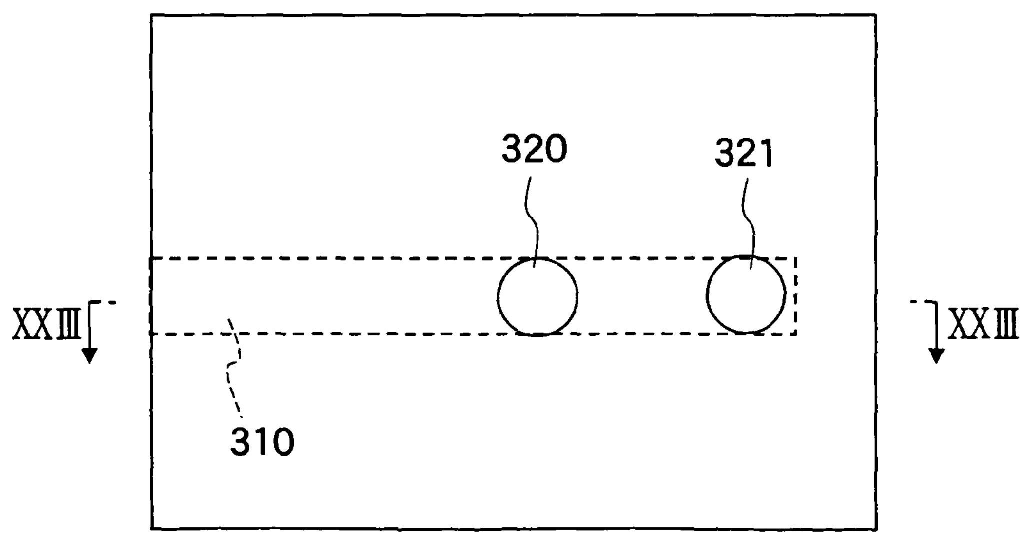

As shown in FIG. 21, the k-th interlayer dielectric 95 is deposited on the lower layer wire 310 and the (k−1)-th interlayer dielectric 93 and surface thereof is planarized. A photoresist film 98 is deposited on the k-th interlayer dielectric 95. The photoresist film 98 is then delineated by using the second reticle 80*b* as shown in FIG. 13 and a part of the k-th interlayer dielectric 95 is selectively removed. As shown in FIG. 22, openings (via holes) 95A, 95B are formed. After removing photoresist film 98, a refractory metal such as tungsten (W), molybdenum (Mo) is plugged in via holes 95A, 95B by sputtering, evaporation, or the like. Then, the surface thereof is planarized. Consequently, as shown in FIGS. 23 and 24, the first via plug 320 and the second via plug 321 are formed.

Figure 25:
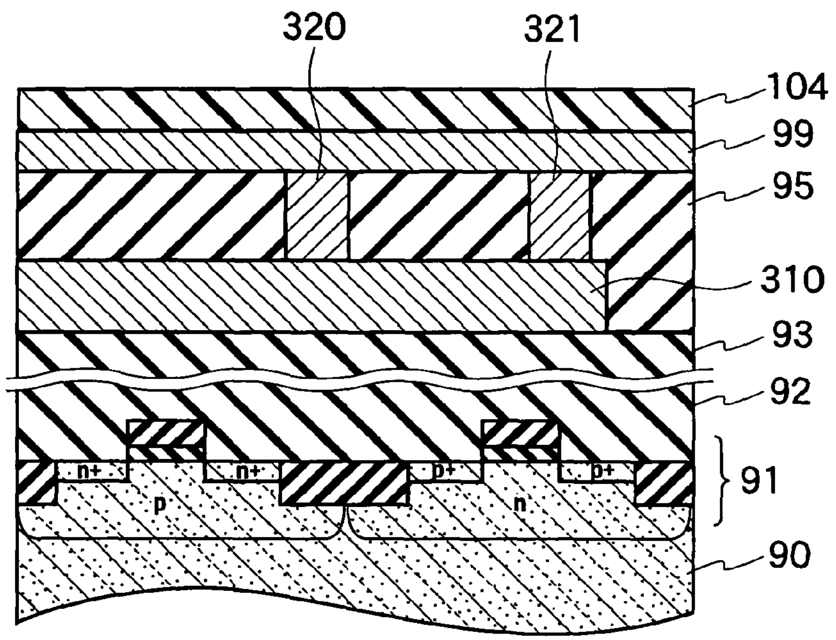
Figure 26:
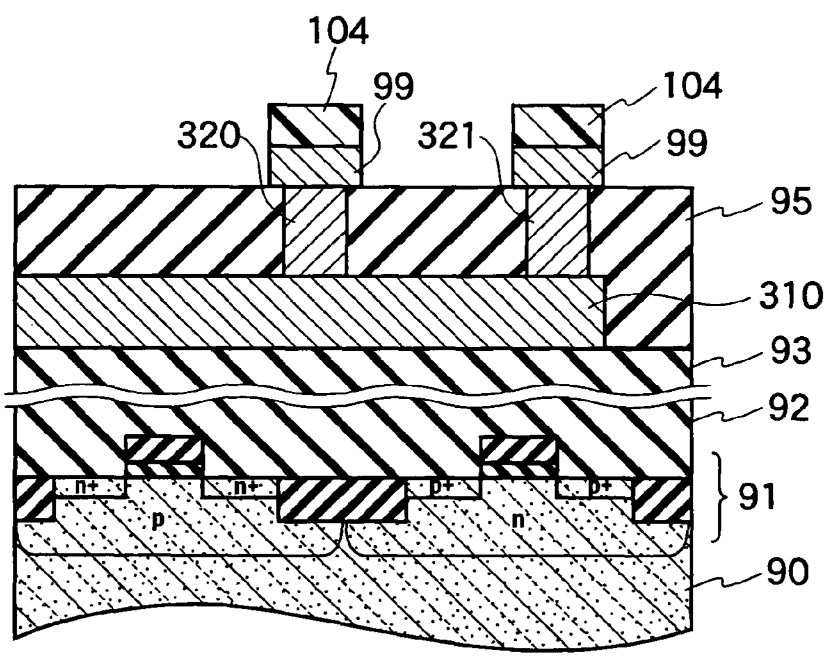
Figure 27:
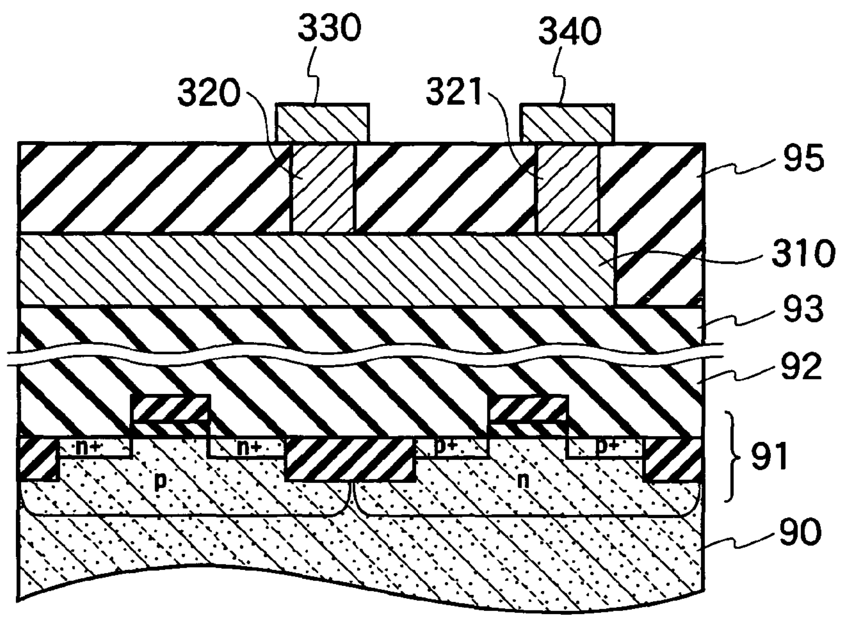
Figure 28:
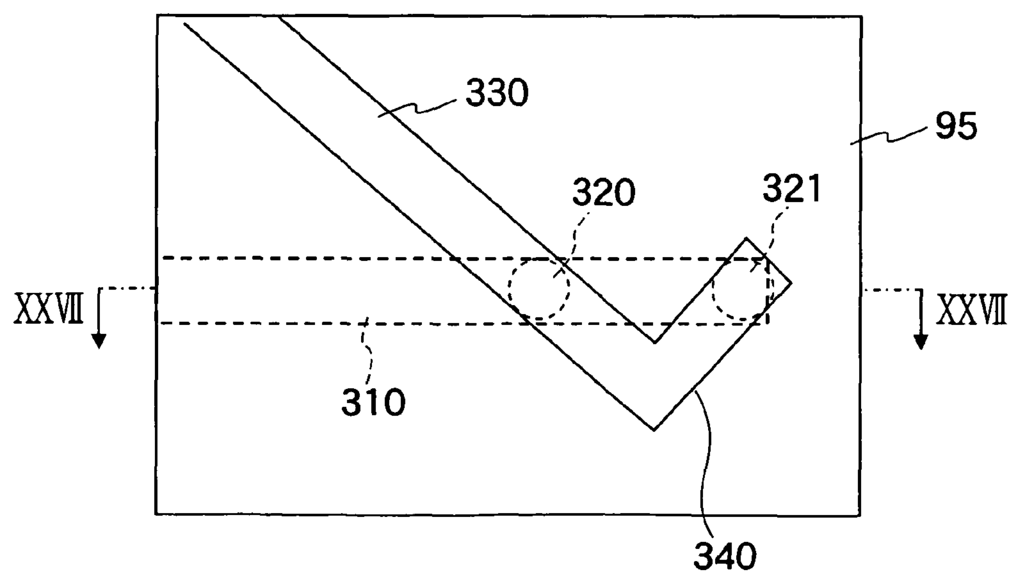
FIG. 28 is a plane view illustrating the method of manufacturing the semiconductor device according to the first embodiment of the present invention.

As shown in FIG. 25, a conductive thin film 99 is deposited on the k-th interlayer dielectric 95, such as Al, Cu by sputtering, evaporation, or the like. A photoresist film 104 is deposited on the conductive thin film 99. The photoresist film 104 is delineated by the third reticle 80*c* as shown in FIG. 15. As shown in FIG. 26, the conductive thin film 99 is selectively stripped by using the delineated photoresist film 104 as a mask. Then, the photoresist film 104 is removed. Consequently, as shown in FIGS. 27 and 28, the upper layer wire 330 and protrusion wire 340 is formed on the k-th interlayer dielectric 95.

With the method of manufacturing the semiconductor IC according to the first embodiment of the present invention, the plurality of via plugs are arranged between the two wires without enlarging widths of the wires. Therefore, it is possible to manufacture the semiconductor IC as designed, compared with the case where a mask including wires with whose enlarged end portions. Since wires arranged on two different layers are interconnected with two via plugs, increases in resistance caused by defective via plugs may be prevented. A decreased yield caused by disconnection of wires may be also prevented. Since the protrusion wire 340 is placed only on one layer, it is possible to place another wires on the other layer. Therefore, the degree of wiring integration of the semiconductor IC will be increased.

First Modification of the First Embodiment

A description will be given of another method of creating double cut vias from data stored in the double cut via geometry file 63 in the step S100 as shown in FIG. 10, by using the flowchart of FIG. 11 and layout chart of FIGS. 29 to 32. Since the method described in the step S101 is substantially the same as the first embodiment, detailed explanations are omitted.

Figure 29:
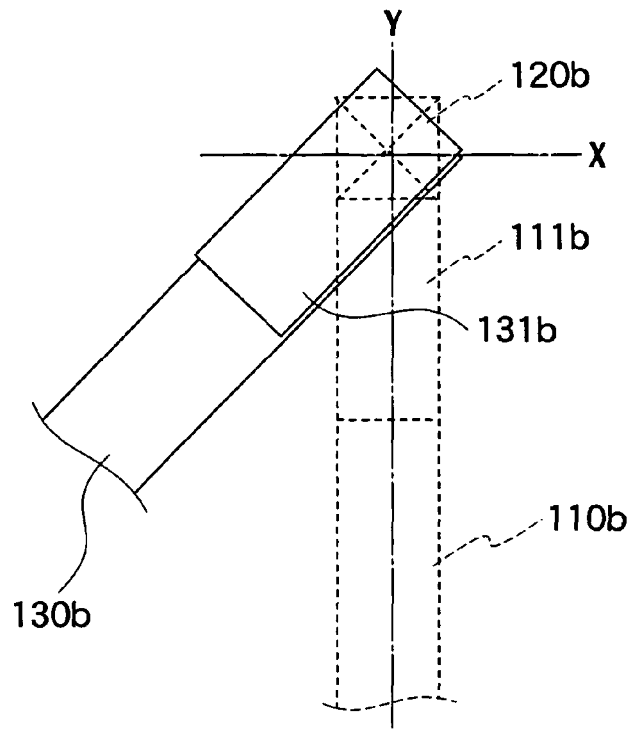
FIG. 29 through FIG. 31 are CAD data illustrating a method of creating a double cut via according to the first modification of the first embodiment of the present invention.

In the step S102 in FIG. 11, the via extract unit 21 extracts a first via pattern 120*b* arranged at the intersection of the lower layer line pattern 110*b* and the upper layer line pattern 130*b* as shown in FIG. 29. In the step S103, the via environment search unit 22 searches the geometrical environment of the via pattern 120*b* such as other line patterns arranged adjacent to the first via pattern 120*b*. For example, in FIG. 29, the via environment search unit 22 searches the geometrical environment and determines that there is a wire placed adjacent to the lower layer line pattern 110*b*, as shown on the right side of the page space of FIG. 29. The via environment search unit 22 also searches location information of grid lines X and Y and links the location information of grid lines X and Y to the first via pattern 120*b*.

In the step S104, the upper layer line extension unit 24 creates a line extension pattern 131*b* based on the wire extension data stored in the line extension geometry file 61 and the via environment stored in the via environment data file 70. For example, since there is a line pattern placed adjacent to the lower layer line pattern 110*b* on right side of the page space of the FIG. 29, the upper layer line extension unit 24 places the line extension pattern 131*b* so as to extend from the end portion of the upper layer line pattern 130*b* to the lower left direction, of the page space.

In the step S105, the lower layer line extension unit 23 places line extension pattern 111*b* based on the line extension data and the geometrical environment stored in the line extension geometry file 61 and the via environment data file 70. For example, as shown in FIG. 29, the lower layer line extension unit 23 places the line extension pattern 111*b* to extend from the end portion of the lower layer line pattern 110*b* to the lower direction of the page space of FIG. 29, so as to overlap with the lower layer line pattern 110*b*.

Figure 30:
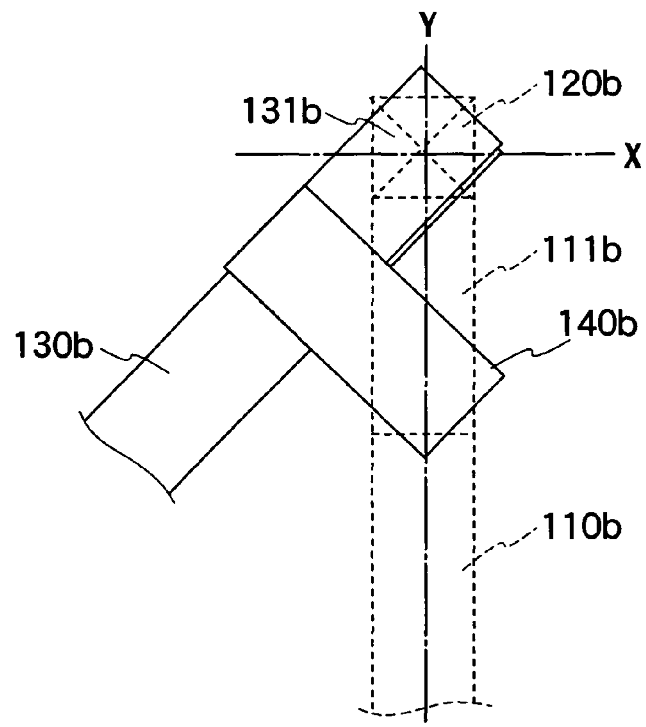
Figure 31:
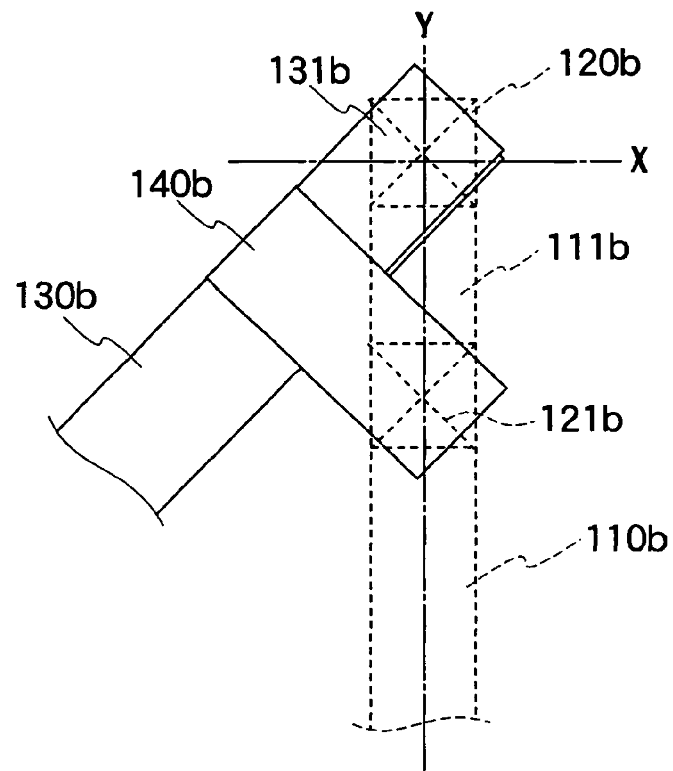
Figure 32:
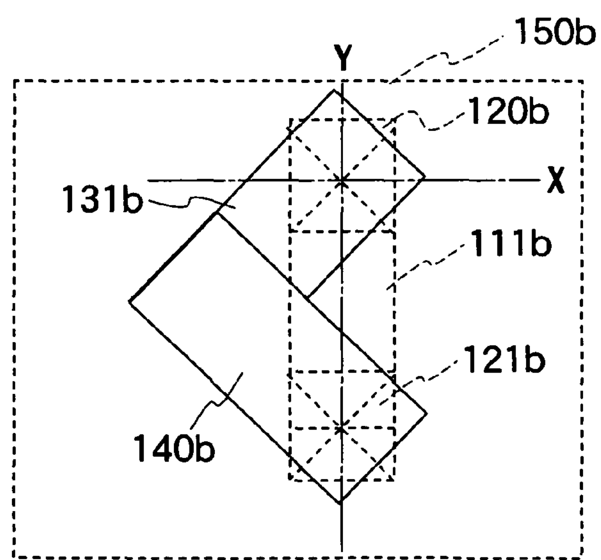
FIG. 32 is CAD data illustrating a double cut via data created by the automated design system according to the first modification of the first embodiment of the present invention.

In the step S106, as shown in FIG. 30, the protrusion line create unit 25 creates a protrusion line pattern 140*b* based on the protrusion line data stored in the protrusion line geometry file 62 and the geometrical environment. An end of the protrusion line pattern 140*b* having the same line width as the upper layer line pattern 130*b* is arranged on the end portion of the line extension pattern and oriented perpendicular to the longitudinal direction of the upper layer line pattern 130*b*. In the step S107, as shown in FIG. 31, the double cut via data extract unit 26 creates a second via pattern 121*b* connecting the line extension pattern 131*b* and the line extension pattern 111*b* on the end portion of the protrusion line pattern 140*b*. Then, as shown in FIG. 32, the double cut via data extract unit 26 extracts data of the double cut via 150*b* including the first via pattern 120*b*, the second via pattern 121*b*, the line extension pattern 111*b*, the line extension pattern 131*b* and the protrusion line pattern 140*b*. The double cut via data extract unit 26 stores data of the double cut via 150*b* and location information of the grid lines X and Y in the double cut via geometry file 63.

According to the computer implemented design method of the first modification of the first embodiment, the line extension pattern 111*b* or the line extension pattern 131*b* may be arranged so as to overlap with the lower layer line pattern 110*b* or the upper layer line pattern 130*b* if there are obstructing wires arranged adjacent to the first via pattern 120*b*. Therefore, the double cut via 150*b* can be placed even if the obstructing wires are arranged around the first via pattern 120*b*.

Second Modification of the First Embodiment

A description will be given of second modification method of creating a double cut via from data stored in the double cut via geometry file 63 in the step S100 by using the flowchart of FIG. 11 and layout of FIGS. 33 through 36. The method described in the step S101 is substantially the same as the first embodiment.

Figure 33:
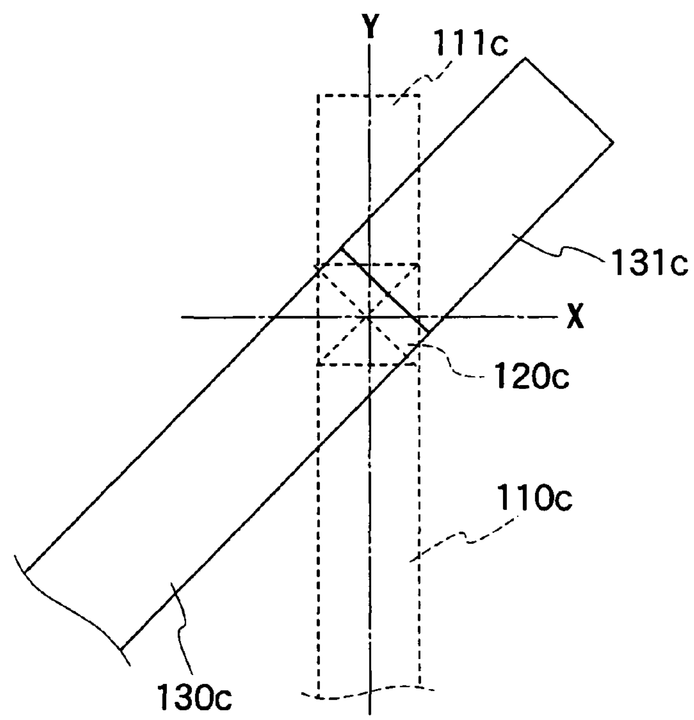
FIG. 33 through FIG. 35 are CAD data illustrating a method of creating a double cut via according to the second modification of the first embodiment of the present invention.

In the step S102 in FIG. 11, the via extract unit 21 extracts a first via pattern 120*c* allocated at an intersection of a lower layer line pattern 110*c* and an upper layer line pattern 130*c* as shown in FIG. 33. In the step S103, the via environment search unit 22 searches the geometrical environment of the via pattern 120*c*. For example, in FIG. 33, the via environment search unit 22 searches the geometrical information to determine that there is no wire adjacent to the lower layer line pattern 110*c*. The via environment search unit 22 also searches location information of grid lines X and Y and stores the geometry information data of grid lines X and Y in the via environment data file 70.

In the step S104, the upper layer line extension unit 24 creates a line extension pattern 131*c* on the end portion of the upper layer line pattern 130*c* orienting to the same direction as the longitudinal direction of the upper layer line pattern 130*c*. In the step S105, the lower layer line extension unit 23 places line extension pattern 111*c* on the end portion of the lower layer line pattern 110*c* based on the wire extension data and geometrical environment.

Figure 34:
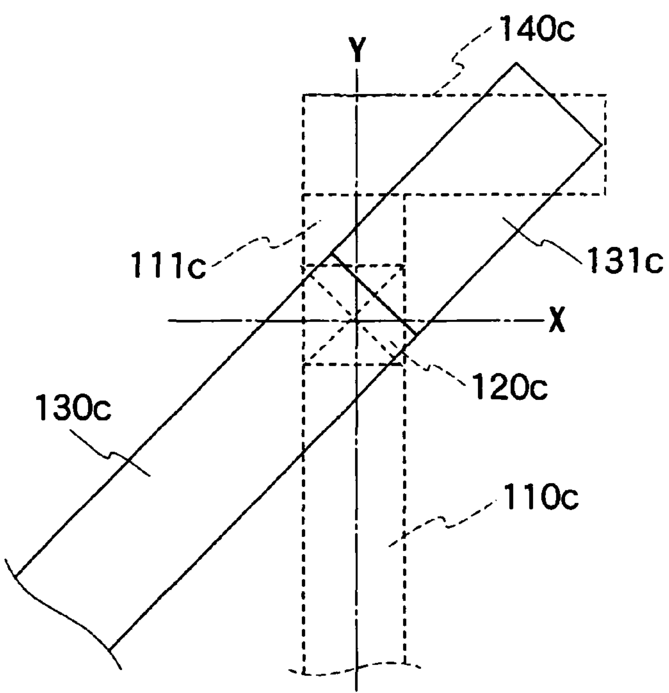
Figure 35:
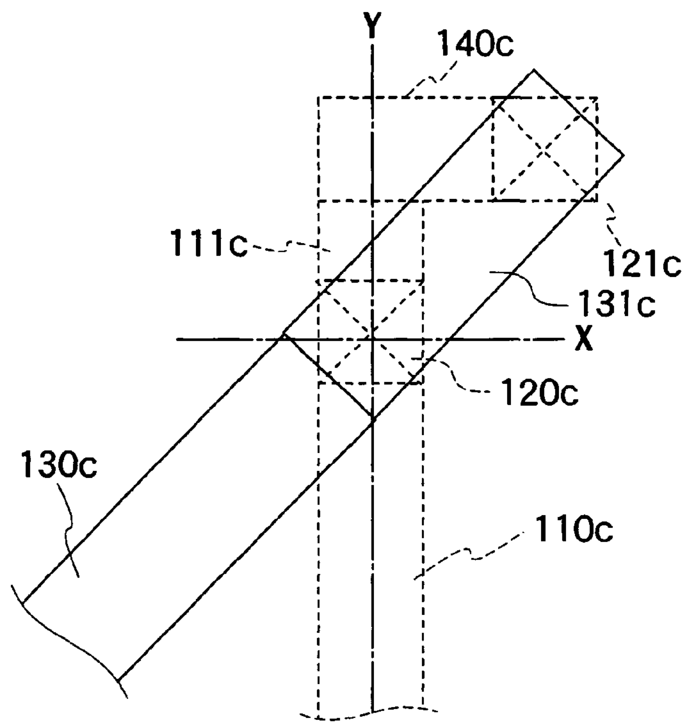
Figure 36:
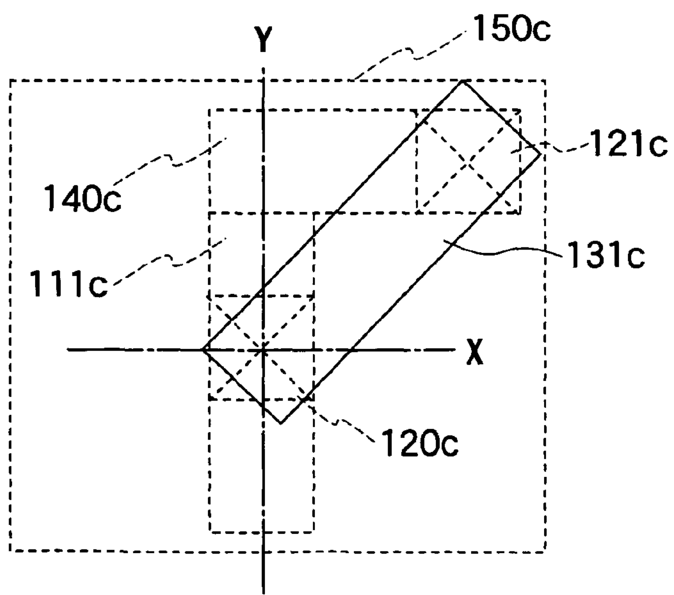
FIG. 36 is CAD data illustrating a double cut via created by the automated design system according to the second modification of the first embodiment of the present invention.

In the step S106, the protrusion line create unit 25 creates a protrusion line pattern 140*c* based on the protrusion line data stored in the protrusion line geometry file 62 and the geometrical environment. As shown in FIG. 34, an end of the protrusion line pattern 140*c* having the same wire width as the lower layer line pattern 110*c* is arranged on the end portion of the line extension pattern 111*c* and oriented perpendicular to the longitudinal direction of the upper layer line pattern 130*c*. In the step S107, as shown in FIG. 35, the double cut via data extract unit 26 creates a second via pattern 121*c*, which connects the line extension pattern 131*c* and the line extension pattern 111*c* on the end portion of the protrusion line pattern 140*c*. Then, as shown in FIG. 36, the double cut via data extract unit 26 extracts the double cut via 150*c* including a via structure having the first via pattern 120*c* and the second via pattern 121*c*. The double cut via data extract unit 26 stores data of double cut via 150*c* and location information of the grids lines X and Y in the double cut via geometry file 63.

According to the computer implemented design method of the second modification of the first embodiment, since the protrusion line pattern 140*c* is connected only on the lower layer line pattern 110*c*, other wires may be placed adjacent to the upper layer line pattern 130*c*. Therefore, the degree of integration of wires in the semiconductor IC will be increased.

Third Modification of the First Embodiment

A description will be given of another method of creating double cut via data file 63 in the step S100 by using the flowchart of FIG. 11 and layout of FIGS. 37 through 40. The method described in the step S101 is substantially the same as the first embodiment.

Figure 37:
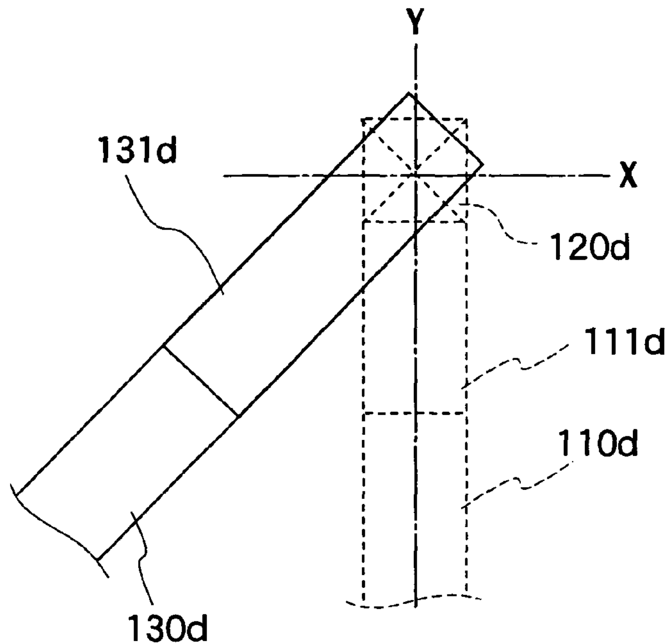
FIG. 37 through FIG. 39 are CAD data illustrating double cut vias according to the third modification of the first embodiment of the present invention.

In the step S102, as shown in FIG. 37, the via extract unit 21 extracts a lower (k−1) layer line pattern 110*d*, an upper (k) layer wire pattern 130*d*, and a first via pattern 120*d* arranged at an intersection of the lower layer line pattern 110*d* and the upper layer line pattern 130*d*. In the step S103, the via environment search unit 22 searches the geometrical environment of the via pattern 120*d*. For example, in FIG. 37 the via environment search unit 22 searches the via environment and determines that there is a line pattern placed adjacent to the lower layer line pattern 110*d* on the right side to the upper side of the page space of FIG. 37. The via environment search unit 22 also searches location information of grid lines X and Y and stores information of grid lines X and Y in the via environment data file 70.

In the step S104, the upper layer line extension unit 24 creates a line extension pattern 131*d* based on the line extension data in the line extension geometry file 61 and the via environment stored in the via environment data file 70. For example, as shown in FIG. 37, the upper layer line extension unit 24 places the line extension pattern 131*d* so as to overlap with the upper layer line pattern 130*d*.

In the step S105, the lower layer line extension unit 23 places a line extension pattern 111*d* based on the line extension data and the via environment stored in the line extension geometry file 61 and the via environment data file 70. For example, the lower layer line extension unit 23 places the line extension pattern 111*d* extend to from the end portion of the lower layer line pattern 110*d* to the lower direction in the page space of FIG. 37 so as to overlap with the lower layer line pattern 110*b*.

Figure 38:
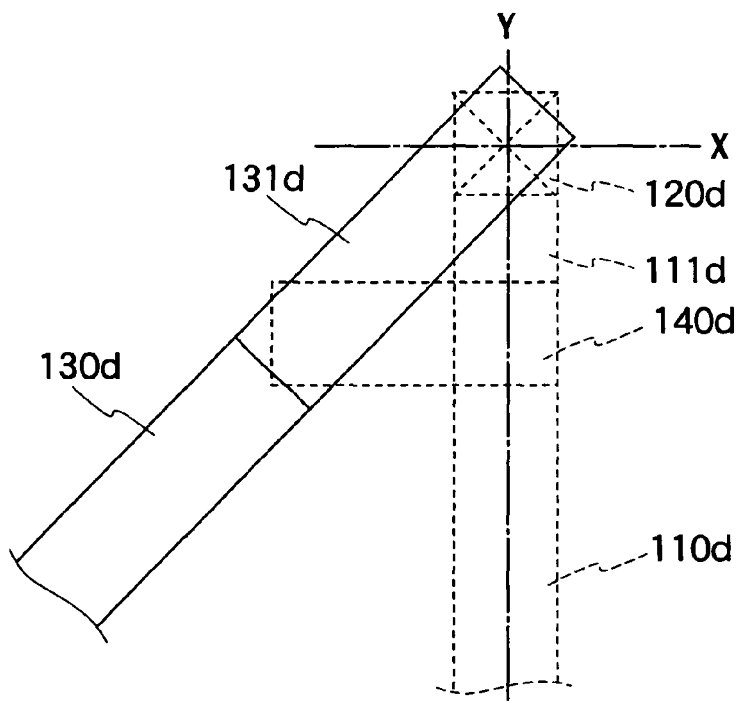
Figure 39:
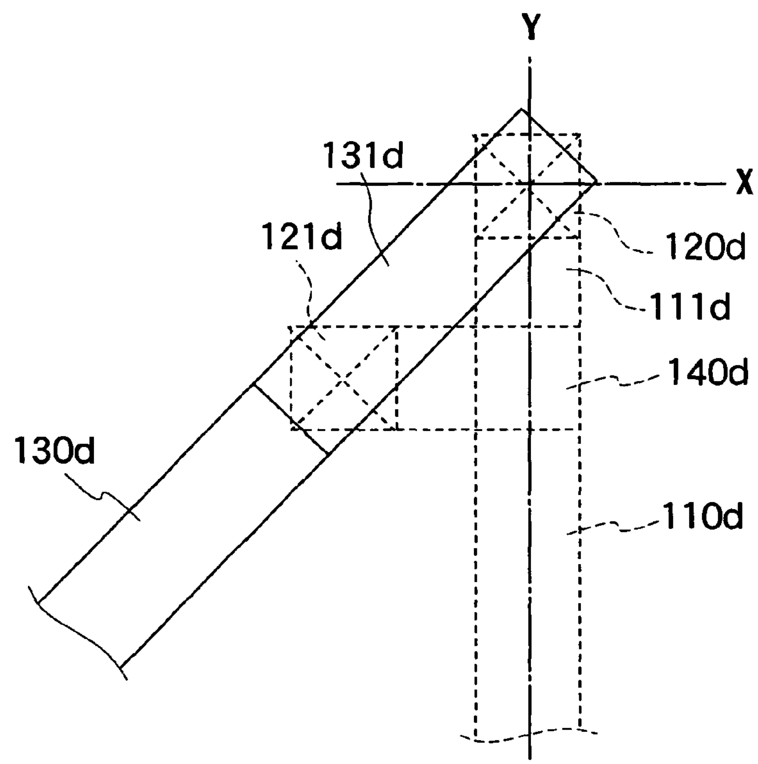
Figure 40:
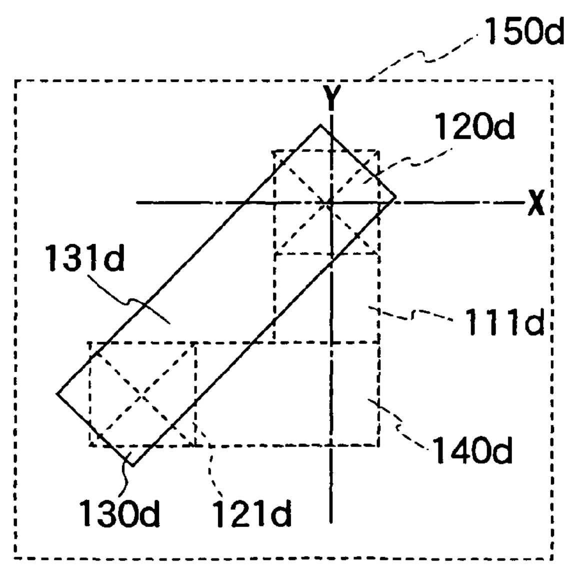
FIG. 40 is CAD data illustrating a double cut via created by the automated design system according to the third modification of the first embodiment of the present invention.

In the step S106, as shown in FIG. 38, the protrusion line create unit 25 creates a protrusion line pattern 140*d* based on the protrusion line data stored in the protrusion line geometry file 62 and the via environment. The protrusion line pattern 140*d* has the same line width as the lower layer line pattern 110*d* and arranged on the end portion of the line extension pattern 111*d*. The protrusion line pattern 140*d* oriented perpendicular to the longitudinal direction of the lower layer line pattern 110*d*. In the step S107, as shown in FIG. 39, the double cut via data extract unit 26 creates a second via pattern 121*d* to connect with the line extension pattern 131*d* and the line extension pattern 111*d*. Then, as shown in FIG. 40, the double cut via data extract unit 26 extracts the double cut via 150*d* including the first via pattern 120*d*, the second via pattern 121*d*, the line extension pattern 111*d*, the line extension pattern 131*d* and the protrusion line pattern 140*d*. The double cut via data extract unit 26 stores data of double cut via 150*d* and location information of the grid lines X and Y in the double cut via geometry file 63.

According to the computer implemented design method of the third modification of the first embodiment, as shown in FIG. 39, the line extension pattern 111*d* may be arranged so as to overlap with the lower layer line pattern 110*d* if there are obstructing wires arranged adjacent to the first via pattern 120*d*. Therefore, the double cut via 150*d* can be provided even if the obstructing line patterns are arranged around the first via pattern 120*d*, and the degree of integration of the semiconductor IC will be increased.

Fourth Modification of the First Embodiment

Figure 41:
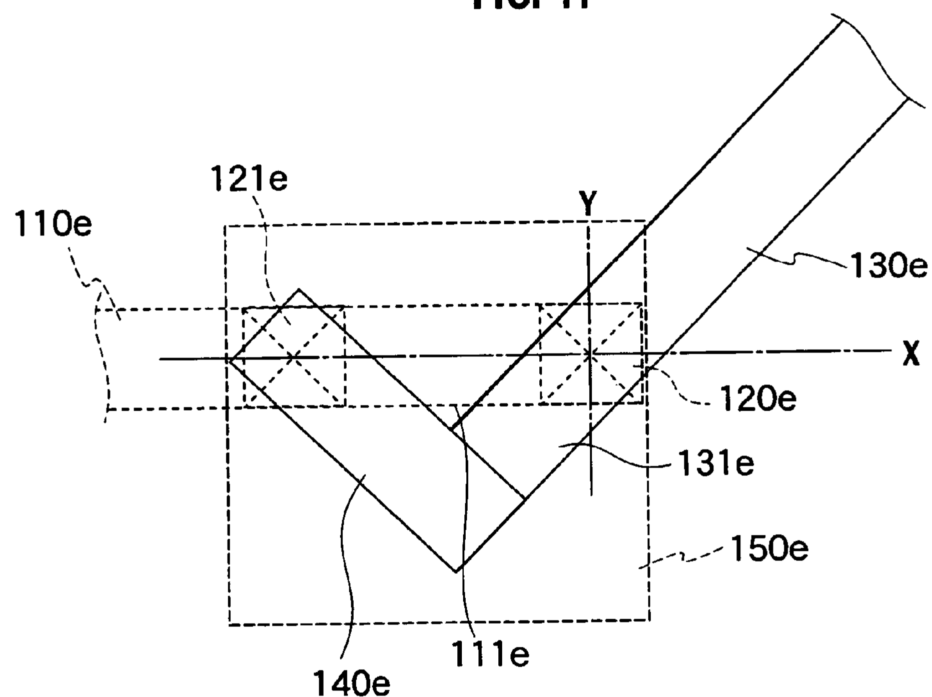
FIG. 41 and FIG. 42 are CAD data illustrating double cut vias according to the fourth modification of the first embodiment of the present invention.
Figure 42:
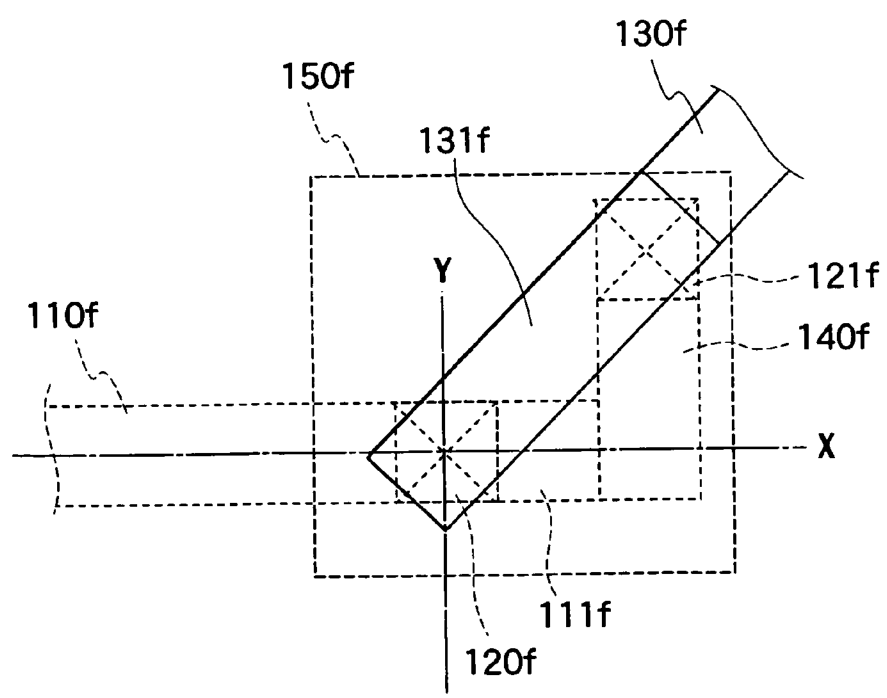

FIGS. 41 and 42 show other examples of layout patterns designed by the automated design system as shown in FIG. 1. Examples as shown in FIGS. 41 and 42 show part of the CAD data of the semiconductor IC after placement of the double cut vias 150*e* and 150*f* is accomplished.

As shown in dotted line in FIG. 41, a lower (k−1) layer line pattern 110*e* is oriented in the horizontal direction with respect to the page space. An upper (k) layer wire pattern 130*e* extending obliquely in the longitudinal direction of the lower layer line pattern 110*e* is placed on the end portion of the lower layer line pattern 110*e*. A first via pattern 120*e* is placed at an intersection of the lower layer line pattern 110*e* and the upper layer line pattern 130*e* to connect with each other.

On an end portion of the lower layer line pattern 110*e*, a line extension pattern 111*e* is provided. On an end portion of the upper layer line pattern 130*e*, a line extension pattern 131*e* is provided. At the end portion of the line extension pattern 131*e*, a protrusion line pattern 140*e* is provided. The protrusion line pattern 140*e* has a longitudinal direction perpendicular to the longitudinal direction of the upper layer line pattern 130*e* and overlapped with an end of the line extension pattern 131*e*. At another end portion of the protrusion line pattern 140*e*, the second via pattern 121*e* is placed to connect with lower layer line pattern 110*e*.

As shown in dotted line in FIG. 42, a lower (k−1) layer line pattern 110*f* is connected to an upper (k) layer wire pattern 130*f* through a first via pattern 120*f*. At the end portion of the upper layer line pattern 130*f*, a line extension pattern 131*f* is provided so as to overlap with the lower layer line pattern 110*f*. A line extension pattern 111*f* extending in the longitudinal direction to the lower layer line pattern 110*f* is connected to the end portion of the lower layer line pattern 111*f*. At the end of the extension pattern 111*f*, a protrusion line pattern 140*f* is provided. The protrusion line pattern 140*f* has a longitudinal direction perpendicular to the longitudinal direction of the upper layer line pattern 130*f*. The second via pattern 121*f* is placed at another end portion of the protrusion line pattern 140*f* to connect with lower layer line pattern 110*f*.

Second Embodiment

Automated Design System

Figure 43:
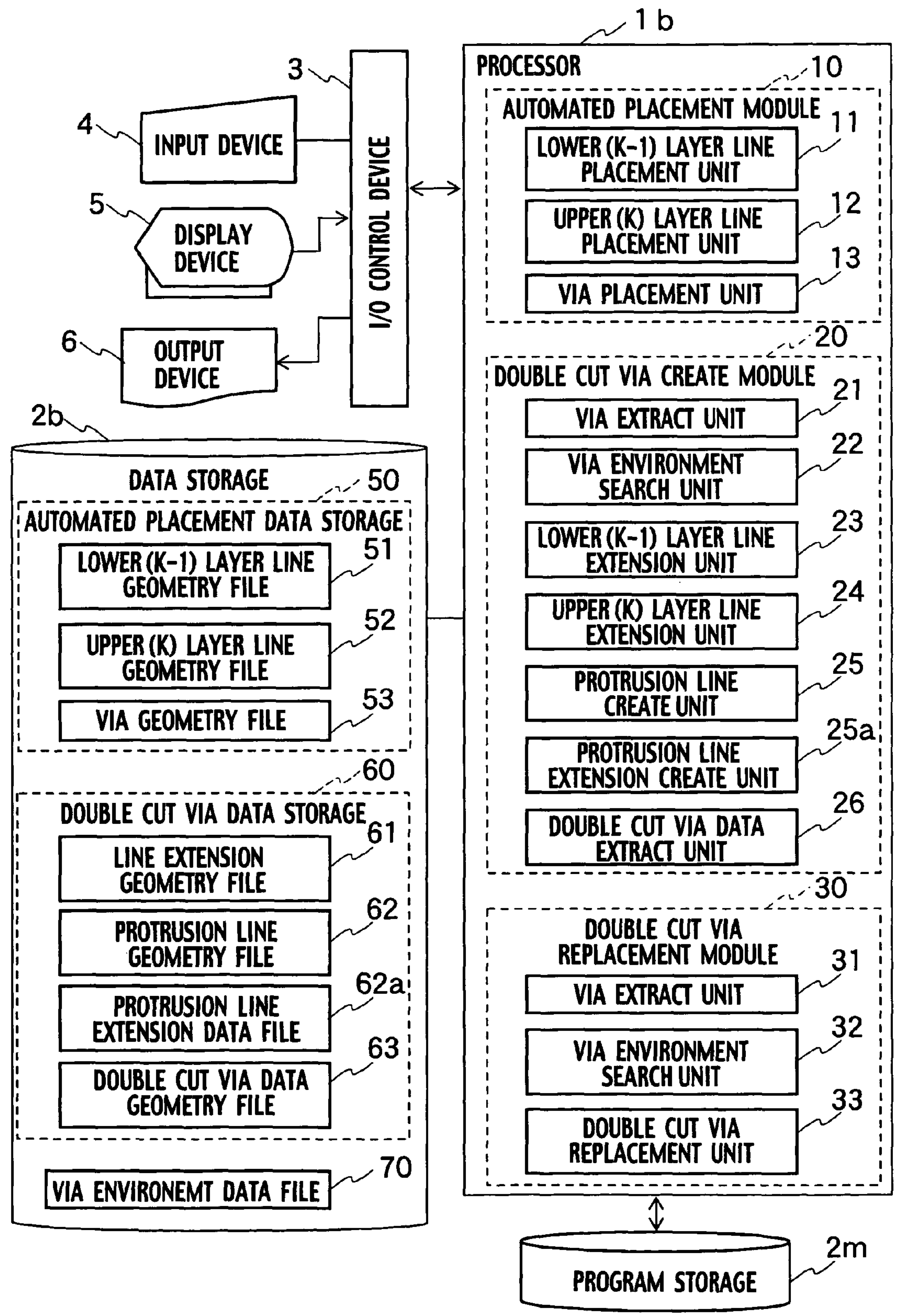
FIG. 43 is a block diagram illustrating an automated design system according to the second embodiment of the present invention.

As shown in FIG. 43, an automated design system according to the second embodiment of the present invention includes an input device 4, a processor (CPU) 1*b*, a display device 5, an output device 6, a data storage 2*b*, and a program storage 2*m*. The input device 4, the display device 5, and the output device 6 are respectively connected to the CPU 1*b*.

Figure 45:
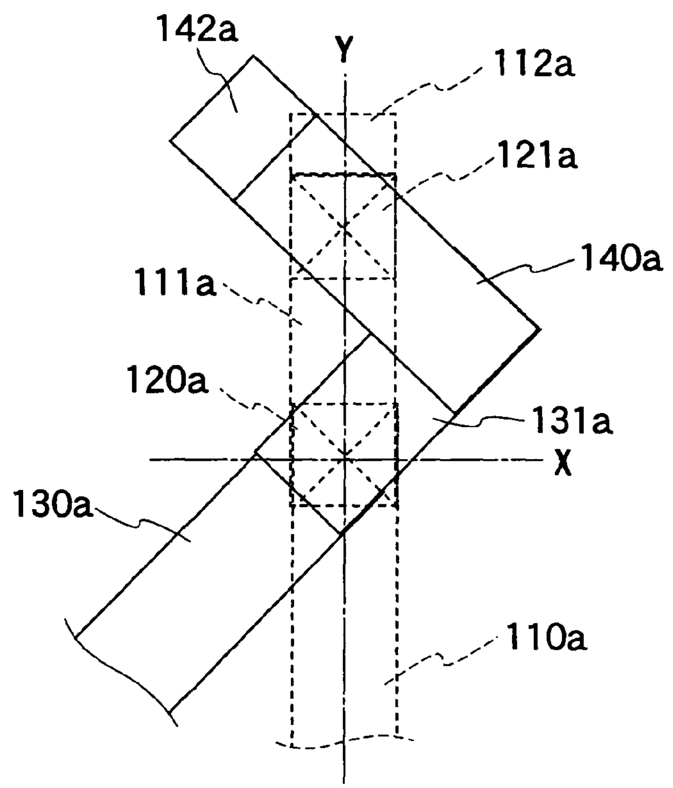
FIG. 45 is CAD data illustrating a double cut via according to the second embodiment of the present invention.

A double cut via create module 20 includes a protrusion line extension create unit 25*a*. As shown in FIG. 45, the protrusion line extension create unit 25*a* creates a protrusion line extension pattern 142*a* at an end portion of the protrusion line pattern 140*a* so as to extend the line length of the protrusion line pattern 140*a* as shown in FIG. 45. The protrusion line extension create unit 25*a* creates a protrusion line extension pattern 112*a* at an end portion of the line extension pattern 111*a* so as to extend the line length of the line extension pattern 111*a*. The double cut via data storage 60 includes a protrusion line extension data file 62*a*, which stores data of shapes and sizes of the protrusion line extension pattern 112*a* and 142*a*.

In the automated design system according to the second embodiment, the protrusion line extension create unit 25*a* creates protrusion line extension pattern 112*a* and 142*a*. Therefore, line length of the protrusion line pattern 140*a* and line extension pattern 111*a* are extended so that disconnection will be prevented. Since various widths and lengths of the protrusion line extension patterns are stored in the protrusion line extension data file 62*a*, suitable size of the protrusion line extension patterns 112*a* and 142*a* may be extracted.

Computer Implemented Method for Designing a Semiconductor IC

Next, a description will be given of a computer implemented method for designing a semiconductor IC according to the second embodiment of the present invention with reference to flowcharts of FIGS. 10 and 44. Steps S100, S110-S150 and S101-106 are the same as those of the flowchart in FIGS. 10 and 11, and the description thereof is omitted.

Figure 44:
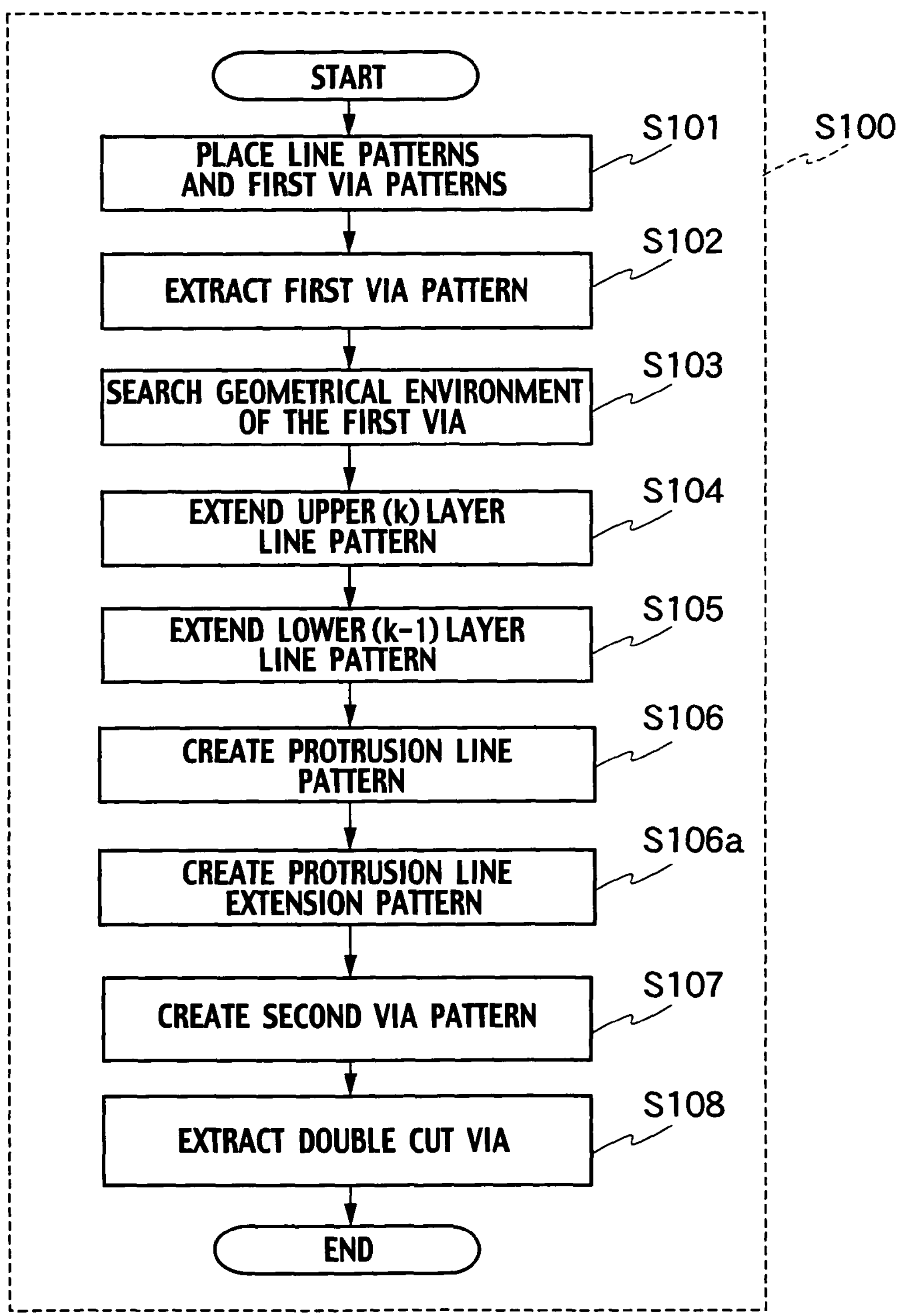
FIG. 44 is a flowchart illustrating a method of designing a semiconductor device according to the second embodiment of the present invention.

In the step S106 in FIG. 44, the protrusion line extension create unit 25*a* creates the protrusion line extension pattern 142*a* as shown in FIG. 45 at the end portion of the protrusion line pattern 140*a*, based on the protrusion line extension data stored in the protrusion line extension data file 62*a* and the via environment stored in the via environment data file 70. The protrusion line extension create unit 25*a* creates the protrusion line extension pattern 112*a* at the end portion of the line extension pattern 111*a*. In the step S107, the double cut via extract unit 26 extracts the intersection of the protrusion line pattern 140*a* and the line extension pattern 111*a*, and create the second via pattern 121*a* on the intersection of the protrusion line pattern 140*a* and the line extension pattern 111*a*.

Figure 46:
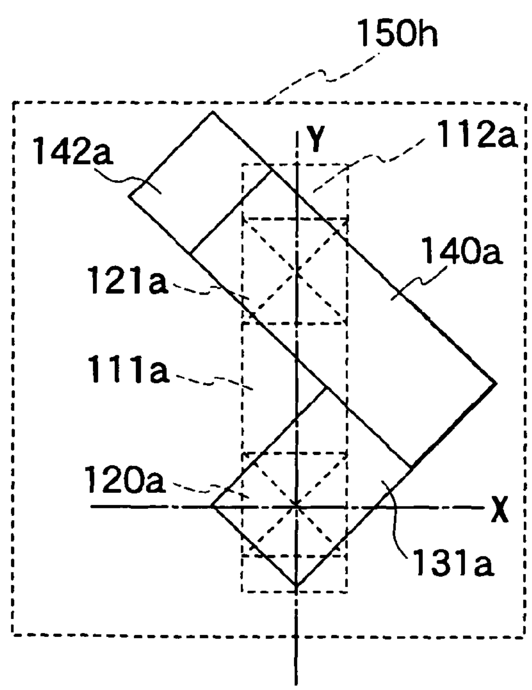
FIG. 46 is CAD data illustrating a double cut via created by the system according to the second embodiment of the present invention.

In the step S108, as shown in FIG. 46, the double cut via data extract unit 26 extract the double cut via 150*h* having the first via pattern 120*a*, the second via pattern 121*a*, the line extension patterns 111*a* and 131*a*, the protrusion line pattern 140*a* and protrusion line extension patterns 112*a* and 142*a*. The double cut via data extract unit stores the double cut via 150*h* in the double cut via geometry file 63. In this event, the double cut via extract unit 26 stores location information of the grids X and Y intersecting on the center of the first via pattern 120*a* and links location information to first via pattern 120*a* of the double cut via pattern 150*h*.

Semiconductor Device

Figure 47:
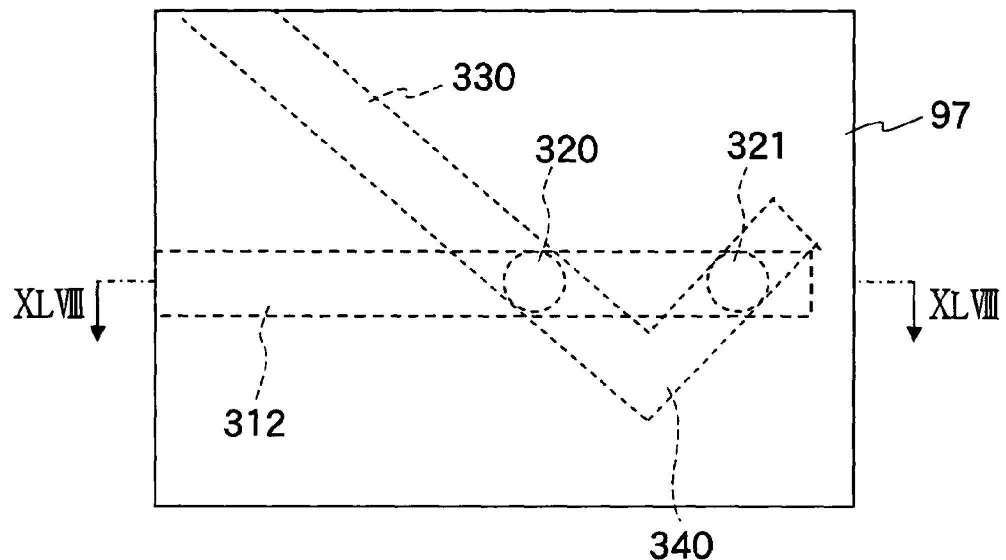
FIG. 47 is a plane view illustrating a semiconductor device according to the second embodiment of the present invention.
Figure 48:
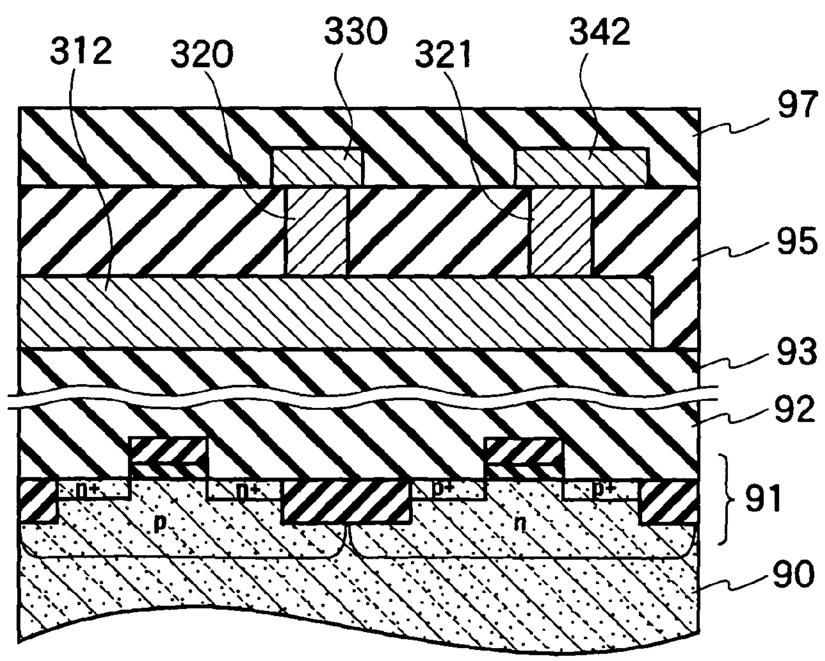
FIG. 48 is a sectional view illustrating a semiconductor device taken on line XLVIII-XLVIII in FIG. 47 according to the second embodiment of the present invention.

FIGS. 47 and 48 show an example of a multi-level interconnect structure of the semiconductor IC according to the second embodiment of the present invention. FIG. 48 shows an example of a cross-sectional view taken on line in XLVIII-XLVIII in FIG. 47.

As shown in FIG. 48, the semiconductor IC includes a semiconductor substrate 90 with a semiconductor element 91 in the isolation region and the first interlayer dielectric 92 deposited on the semiconductor substrate 90. A (k−1)-th interlayer dielectric 93 is arranged on the first interlayer dielectric 92. The lower (k−1) layer wire 312 is arranged on the (k−1)-th interlayer dielectric 93. The lower layer wire 312 can be formed by delineating a metal film of aluminum (Al), aluminum alloy, copper (Cu), or the like by photolithography and RIE by using a reticle based on CAD data as shown in FIG. 45. Wire length of the lower layer wire 312 is longer than the lower layer wire 310 as shown in FIG. 16 of the first embodiment, because the CAD data further includes the protrusion line extension pattern 112*a* as shown in FIG. 45.

As shown in FIG. 48, a k-th interlayer dielectric 95 is arranged on the (k−1)-th interlayer dielectric 93 and the lower layer wire 312. A protrusion wire 342 connected to the upper (k) layer wire 330 is arranged on the k-th interlayer dielectric 95. As shown in FIG. 47, the upper layer wire 330 extends 45 degrees clockwise in the longitudinal direction of the lower layer wire 312. The protrusion wire 342 having the same width as the upper layer wire 330 is connected to the end portion of the upper layer wire 330. The protrusion wire 330 has a longitudinal direction perpendicular to the longitudinal direction of the upper layer wire 330. The upper layer wire 330 and the protrusion wire 342 can be formed by delineating a metal film of Al, Al alloy, Cu, or the like by photolithography and RIE, by using a reticle manufactured from CAD data as shown in FIG. 45.

Therefore, the wire length of the protrusion wire 342 is longer than the protrusion wire 340 because the CAD data further includes the protrusion line extension pattern 142*a*.

First and second via plugs 320, 321 connecting the lower layer wire 310 and the upper layer wire 330 are arranged in the k-th interlayer dielectric 95. As shown in FIG. 47, the first via plug 320 is arranged on the intersection of the lower layer wire 312 and the upper layer wire 330. The second via 321 is arranged on the intersection of the protrusion wire 342 and the lower layer wire 312. The first and second via plugs 320, 321 can be formed by delineating a metal film of aluminum (Al), aluminum alloy, copper (Cu), or the like by photolithography and RIE, by using a reticle manufactured from the CAD data as shown in FIG. 45.

With the semiconductor IC of the second embodiment of the present invention, when the upper and lower wire layers intersects obliquely are connected with a plurality of vias, the protrusion wire 340, having the same width as other wires, is placed perpendicular to the longitudinal direction of the upper layer wire 330. Therefore, the wires can be manufactured as designed on the mask as compared with the mask having various wire widths and sizes. Moreover, as shown in FIG. 47, when connecting the upper and lower wire layers including oblique wires with a plurality of vias, a protrusion wire 342 having the same size as other wires may be placed perpendicular to the longitudinal direction of the other wires. Therefore, the widths of wires will become uniform in the layout and it is easier to manufacture a mask as designed compared to the case where the width of wires is varied. Further, as shown in FIG. 47, since the protrusion wire 342 and lower layer wire 312 are extended by placing the wire extensions at the end portion of the protrusion wire 342 and the lower wire 312, an increased resistance caused by defective vias, and decreased yield caused by disconnection of wires will be prevented. Therefore, manufacturing yield and reliability will be increased. Since a method of manufacturing the semiconductor IC according to the second embodiment is substantially the same as the first embodiment, detailed explanations are omitted.

First Modification of the Second Embodiment

A description will be given of another method of creating a double cut via from data stored in the double cut via geometry file 63 by using a flowchart of FIG. 11 and layout chart of FIGS. 49 and 50. Since the method described in the step S101 is substantially the same as the first embodiment, detailed explanations are omitted.

Figure 49:
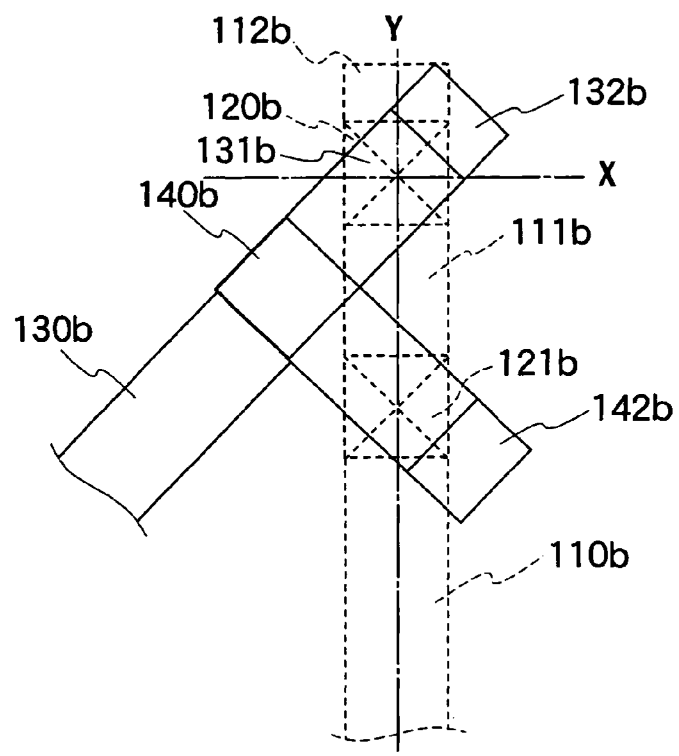
FIG. 49 is CAD data illustrating a method of creating a double cut via according to the first modification of the second embodiment of the present invention.

In the step S106, as shown in FIG. 49, the protrusion line extension create unit 25*a* creates a protrusion line extension pattern 142*b* at the end portion of the protrusion line pattern 140*b*, based on the protrusion line data stored in the protrusion line geometry file 62 and the geometrical environment. The protrusion line extension create unit 25*a* creates a protrusion line extension pattern 112*b* at the end portion of the line extension pattern 111*b* connected to the lower layer line pattern 110*b*. The protrusion line extension create unit 25*a* also creates a protrusion line extension pattern 132*b* at the end portion of the line extension pattern 131*b* connected to the upper layer line pattern 130*b*.

In the step S107, the double cut via data extract unit 26 creates the second via pattern 121*b* at the intersection of the protrusion line pattern 140*b* and the line extension pattern 111*b*.

Figure 50:
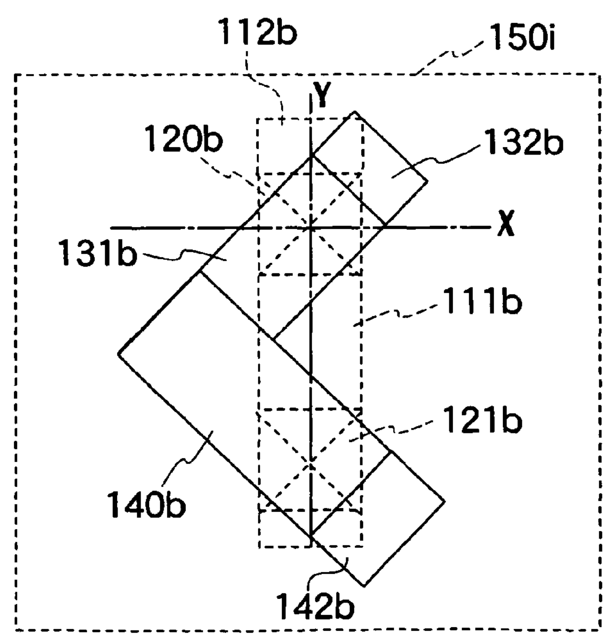
FIG. 50 is CAD data illustrating a double cut via crated by the system according the first modification of the second embodiment of the present invention.

In the step S108, as shown in FIG. 50, the double cut via data extract unit 26 extracts the double cut via 150*i* including the first via pattern 120*b*, the second via pattern 121*b*, the line extension pattern 111*b*, the line extension pattern 131*b*, the protrusion line pattern 140*b*, and the protrusion line extension patterns 112*b*, 132*b* and 142*b*. The double cut via data extract unit 26 stores data of double cut via 150*i* and arrangement data of the grids X and Y in the double cut via geometry file 63.

With the computer implemented design method of the first modification of the first embodiment, the wire length of the line extension pattern 111*b* and the line extension pattern 131*b* may be extended by the protrusion line extension pattern 112*b* and 142*b*. Therefore, a decreased yield caused by disconnection of wires may be prevented.

Second Modification of the Second Embodiment

Figure 51:
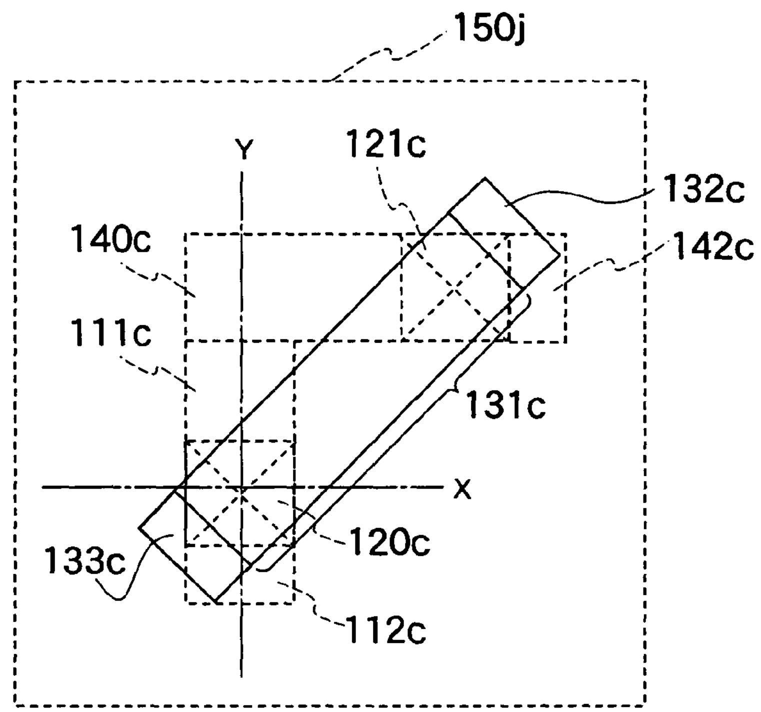
FIG. 51 and FIG. 52 are CAD data according to the second modification of the second embodiment of the present invention.
Figure 52:
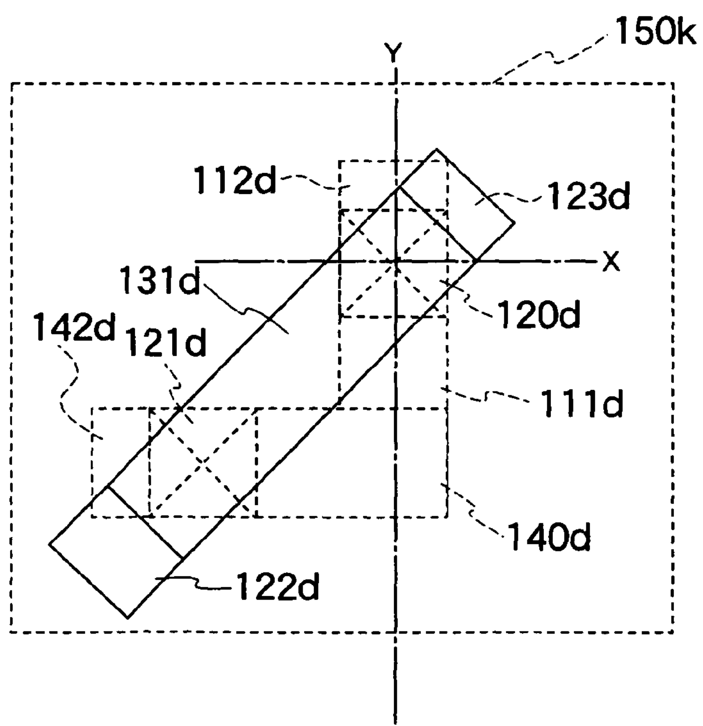

FIGS. 51 and 52 show examples of double cut vias 150*j* and 150*k* designed by the automated design system according to the second embodiment.

As shown in dotted line in FIG. 51, a protrusion line extension pattern 142*c* is placed at the end portion of the protrusion line pattern 140*c* and oriented perpendicular to the longitudinal direction of the line extension pattern 111*c*. The protrusion line pattern 140*c* has the same line width as the line extension pattern 111*c*. Another line extension pattern 112*c* is placed at the end portion of the line extension pattern 111*c*.

An upper layer line extension pattern 131*c* is oriented 135 degrees counterclockwise from the longitudinal direction of the lower layer pattern 111*c*. First and second line extension patterns 132*c* and 133*c* is connected to the each of the ends of the upper layer line pattern 131*c*. First and second via patterns 120*c* and 121*c* are placed to interconnect with the upper and lower line patterns 111*c* and 121*c*.

As shown in dotted line in FIG. 52, a protrusion line pattern 140*d* is provided at the end portion of the line extension pattern 111*d* and oriented perpendicular to the longitudinal direction of the line extension pattern 111*d*. The protrusion line pattern 140*d* has the same line width as the line extension pattern 111*d*. A protrusion line extension pattern 142*d* is placed at the end of the protrusion line pattern 140*d*. Another line extension pattern 123*d* may be provided on the end of the line extension pattern.

An upper layer line pattern 131*d* is oriented 135 degrees counterclockwise from a longitudinal direction of the line extension pattern 111*d*. First and second line extension patterns 122*d* and 123*d* are placed at each of the ends of the upper layer line pattern 131*d*. The first and second vias 120*d* and 121*d* are placed to interconnect with the upper and lower line patterns 111*d* and 131*d*.

According to the double cut vias 150*j* and 150*k* as shown in FIGS. 51 and 52, since the each of the line patterns may be extended, disconnection between lines will be prevented.

Other Embodiments

Figure 53:
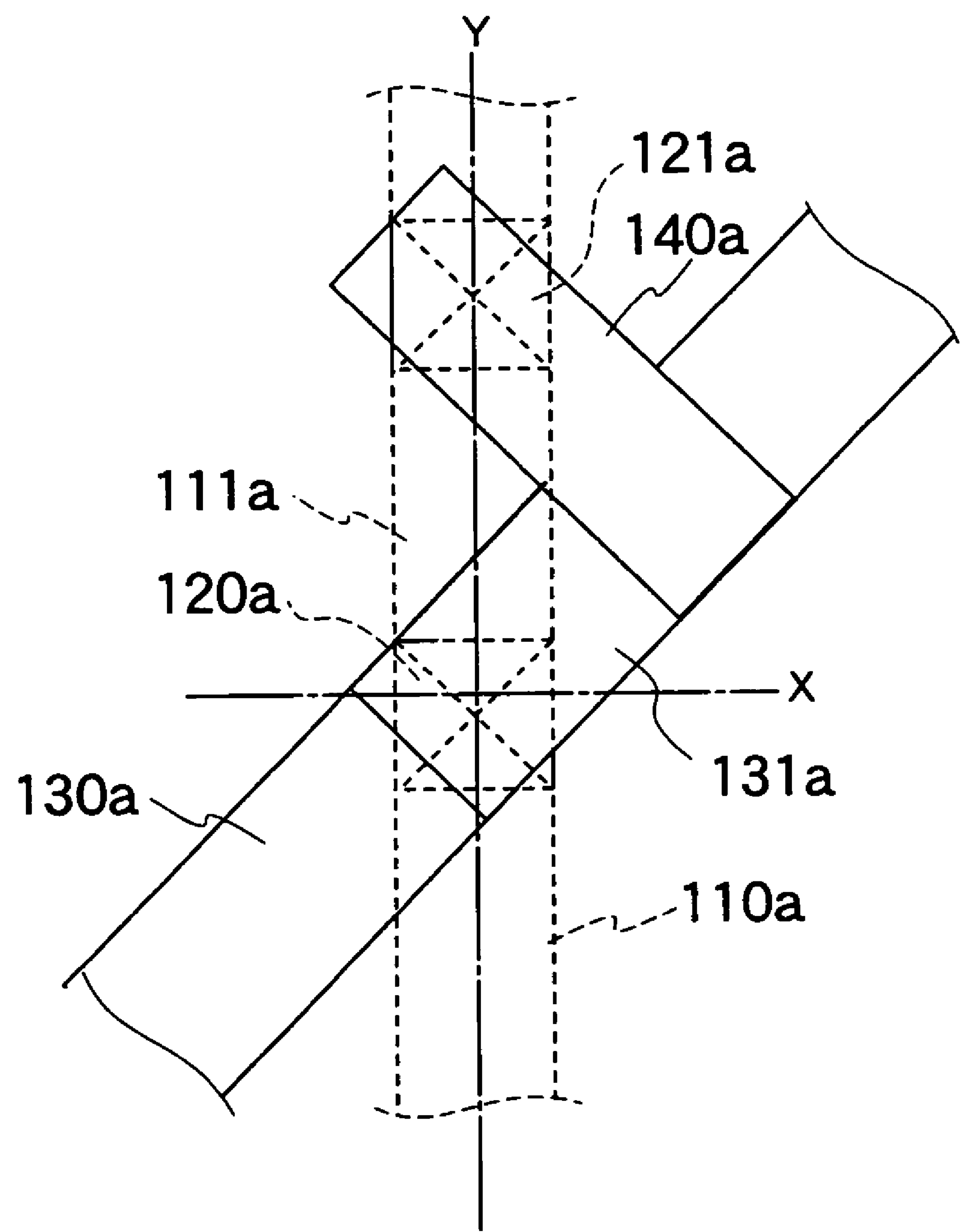
FIG. 53 is CAD data according to the other embodiments of the present invention.

Various modifications will become possible for those skilled in the art after receiving the teachings of the present disclosure without departing from the scope thereof. In the first and second embodiments of the present invention, the first via patterns 120*a*, 120*b* . . . are placed on end portions of the wires. However, the first via patterns 120*a*, 120*b* . . . can be placed at any position where two line patterns are crossing. For example, in FIG. 53, the first via pattern 120*a* is not placed on the end portions of the lower layer line pattern 110*a* and the upper layer line pattern 130*a*.

What is claimed is:

1. A semiconductor device comprising:

a first wire;

an interlayer dielectric disposed on the first wire;

first and second via plugs buried in the interlayer dielectric connected to the first wire;

a second wire disposed on the interlayer dielectric, the second wire oriented obliquely to a longitudinal direction of the first wire and intersects with the first wire where the first via plug is disposed; and a protrusion wire having a same wire width as the second wire, disposed on a same layer level as the second wire on the interlayer dielectric and oriented obliquely to the longitudinal direction of the first wire and oriented perpendicularly to a longitudinal direction of the second wire, wherein an end of the protrusion wire is connected to an end of the second wire on a same layer level as the second wire and another end thereof is connected only to the second via on the first wire, and wherein the first and second via plugs are provided away from a connected portion of the second wire and the protrusion wire, and wherein another end of the second wire extends beyond the first wire.

2. The device of claim 1, wherein the protrusion wire has a same wire width as the first and second wires.

3. The device of claim 2, wherein the end of the protrusion wire is extended in a longitudinal direction of the protrusion wire.

4. The device of claim 2, wherein the second wire and the protrusion wire are arranged together so as to form an L-shape on the interlayer dielectric.

5. The device of claim 1, wherein the end of the protrusion wire is extended in the longitudinal direction of the protrusion wire.

6. The device of claim 1, wherein the first and second wires are copper wires.

7. The device of claim 1, wherein the second wire and the protrusion wire are arranged together so as to form an L-shape on the interlayer dielectric.

8. A semiconductor device comprising:

a first wire;

an interlayer dielectric disposed on the first wire;

a first and second via plugs buried in the interlayer dielectric connected to the first wire;

a second wire disposed on the interlayer dielectric and connected to an end of the first wire through the first via plug, the second wire oriented obliquely to a longitudinal direction of the first wire; and a protrusion wire disposed on a same layer level as the second wire on the interlayer dielectric and having a same wire width as the second wire and oriented obliquely to the longitudinal direction of the first wire and oriented perpendicularly to a longitudinal direction of the second wire, wherein an end of the protrusion wire is connected to an end of the second wire on a same layer level as the second wire and another end thereof is connected only to the second via on the first wire, and wherein the first via plug and the second via plug are provided away from a connected portion of the second wire and the protrusion wire, and where another end of the second wire extends beyond the first wire.

9. The device of claim 8, wherein the protrusion wire has a same wire width as the first and second wires.

10. The device of claim 9, wherein the end of the protrusion wire is extended in a longitudinal direction of the protrusion wire.

11. The device of claim 9, wherein the second wire and the protrusion wire are arranged together so as to form an L-shape on the interlayer dielectric.

12. The device of claim 8, wherein the end of the protrusion wire is extended in the longitudinal direction of the protrusion wire.

13. The device of claim 8, wherein the first and second wires are copper wires.

14. The device of claim 8, wherein the second wire and the protrusion wire are arranged together so as to form an L-shape on the interlayer dielectric.

15. A semiconductor device comprising:

a first wire;

an interlayer dielectric disposed on the first wire;

a first via plug buried in the interlayer dielectric connected to an end of the first wire;

a second via plug buried in the interlayer dielectric, provided adjacent to the first via and connected to the first wire;

a second wire disposed on the interlayer dielectric, the second wire oriented obliquely to a longitudinal direction of the first wire and intersects with the first wire where the second via plug is disposed; and a protrusion wire disposed on a same layer level as the second wire on the interlayer dielectric and having the same wire width as the second wire, the protrusion wire being oriented obliquely to the longitudinal direction of the first wire and being oriented perpendicularly to a longitudinal direction of the second wire, wherein an end of the protrusion wire is connected to an end of the second wire on a same layer level as the second wire and another end thereof is connected only to the second via on the first wire, and wherein the first via plug and the second via plug are provided away from a connected portion of the second wire and the protrusion wire, and wherein another end of the second wire extends beyond the first wire.

16. The device of claim 15, wherein the protrusion wire has a same wire width as the first and second wires.

17. The device of claim 16, wherein the end of the protrusion wire is extended in a longitudinal direction of the protrusion wire.

18. The device of claim 15, wherein the end of the protrusion wire is extended in the longitudinal direction of the protrusion wire.

19. The device of claim 15, wherein the first and second wires are copper wires.

20. The device of claim 15, wherein the second wire and the protrusion wire are arranged together so as to form an L-shape on the interlayer dielectric.

* * * * *